United States Patent [19]
Hosokawa et al.

[11] Patent Number: 6,124,024
[45] Date of Patent: *Sep. 26, 2000

[54] ORGANIC ELECTROLUMINESCENCE DEVICE

[75] Inventors: Chishio Hosokawa; Masahide Matsuura, both of Sodegaura, Japan

[73] Assignee: Idemitsu Kosan Co., Ltd., Tokyo, Japan

[*] Notice: This patent is subject to a terminal disclaimer.

[21] Appl. No.: 09/239,519

[22] Filed: Jan. 29, 1999

Related U.S. Application Data

[63] Continuation of application No. 08/929,098, Sep. 15, 1997, Pat. No. 5,891,554, which is a continuation of application No. 08/383,239, Feb. 3, 1995, abandoned.

[30]     Foreign Application Priority Data

Feb. 25, 1994  [JP]  Japan ................................ 6-027853

[51] Int. Cl.$^7$ .............................. B32B 7/02; H05B 33/00
[52] U.S. Cl. .................... 428/212; 428/411.1; 428/457; 428/690; 428/917; 313/506; 257/98
[58] Field of Search ................................ 428/212, 411.1, 428/457, 690, 917; 313/506; 257/98

[56]              References Cited

U.S. PATENT DOCUMENTS 5,121,029   6/1992   Hosokawa et al. ..................... 313/504
5,216,331   6/1993   Hosokawa et al. .
5,891,554   4/1999   Hosokawa et al. ..................... 428/212

*Primary Examiner*—Marie Yaminitzky
*Attorney, Agent, or Firm*—Oblon, Spivak, McClelland, Maier & Neustadt, P.C.

[57]              ABSTRACT

An organic electroluminescence device in which the following total optical thickness is set at a value which enhances the intensity of the central wave length $\lambda$ ($\lambda$ being selected in the ranges of 440 to 490 nm, 500 to 550 nm, and 600 to 650 nm) of the electroluminescence light emitted from the organic multi-layer part having a refractive index of 1.6 to 1.8: (1) in the construction of a substrate/a transparent electrode of a high refractivity/an organic multi-layer part/a cathode, the total optical thickness of the transparent electrode of a high refractivity and the organic multi-layer part; (2) in the construction of a substrate/an underlayer of a high refractivity/a transparent electrode/an organic multi-layer part/a cathode, the total optical thickness of the underlayer of a high refractivity, the transparent electrode, and the organic multi-layer part or the total optical thickness of the transparent electrode and the organic multi-layer part; and (3) in the construction of a substrate/an underlayer of a low refractivity/a transparent electrode/an organic multi-layer part/a cathode, the total optical thickness of the transparent electrode and the organic multi-layer part. The device has a simple construction and the color purity of the blue light emission is particularly increased.

3 Claims, 1 Drawing Sheet

ORGANIC ELECTROLUMINESCENCE DEVICE

This application is a Continuation of application Ser. No. 08/929,098, filed on Sep. 15, 1997, now U.S. Pat. No. 5,891,554, which is a Continuation of application Ser. No. 08/383,239, filed on Feb. 3, 1995, abandoned.

BACKGROUND OF THE INVENTION

1. Field of the Invention

The present invention relates to a novel organic electroluminescence (hereinafter referred to as EL) device. More particularly, the present invention relates to an organic EL device having a specific construction in which the optical thickness from an anode to a cathode is controlled and the color purity of the blue light emission is particularly increased.

2. Description of the Related Arts

EL devices show high self-distinguishability because of the self-emission, and are excellent in impact resistance and easy handling because they are completely solid devices. Therefore, EL devices have been attracting attention for application as light emitting devices in various types of display apparatus.

The EL device includes an inorganic EL device in which an inorganic compound is used as the light emitting material, and an organic EL device in which an organic compound is used as the light emitting material. The organic EL device has been extensively studied for practical application because the applied voltage can be decreased to a large extent.

As for the construction of the organic EL device, the basic construction comprises an anode/a light emitting layer/a cathode. (This description shows that an anode, a light emitting layer, and a cathode are laminated in this order. Other constructions are described similarly.) Constructions having a hole injecting and transporting layer or an electron injecting and transporting layer suitably added to the basic construction are known. Examples of such construction are a construction of an anode/a hole injecting and transporting layer/a light emitting layer/a cathode and a construction of an anode/a hole injecting and transporting layer/a light emitting layer/an electron injecting and transporting layer/a cathode. The hole injecting and transporting layer has the function of transporting holes injected from the anode to the light emitting layer. The electron injecting and transporting layer has the function of transporting electrons injected from the cathode to the light emitting layer. It has been known that, when the hole injecting and transporting layer is inserted between the light emitting layer and the anode, more holes are injected into the light emitting layer in a lower electric field, and electrons injected into the light emitting layer from the cathode or the electron injecting and transporting layer are accumulated at the interface between the hole injecting and transporting layer and the light emitting layer because the hole injecting and transporting layer does not transport electrons. As the result, efficiency of the light emission is increased.

In the organic EL devices described above, various attempts have been made to increase the efficiency and the luminance by controlling thickness of various layers in the multi-layer organic part placed between the anode and the cathode, such as the hole injecting and transporting layer, the light emitting layer, and the electron injecting layer.

For example, it was disclosed that, in a construction of an anode/a light emitting layer having the hole transporting property/an electron transporting layer/a cathode, the efficiency of the light emission was increased by controlling thickness of the electron transporting layer in the range of 30 to 60 nm (Japanese Patent Application Laid-Open No. Heisei 4(1992)-137485. This technology showed that the distance between the light emitting layer and the cathode is an important factor. In another technology, thickness of the electron transporting layer is controlled in such a manner that the intensity of the light is substantially enhanced with the light emitted directly from the light emitting layer and the light reflected at the cathode interfere with each other (Japanese Patent Application Laid-Open No. Heisei 4(1992)-328295).

However, these technologies described above did not disclose that color purity of a device can be improved by suitably selecting thickness of the layers including organic layers placed between two reflecting interfaces. Furthermore, it is necessary in these technologies that the thickness of the electron transporting layer is controlled, and due to this requirement, the electron injecting layer influences the light emission process and cause unfavorable results, such as deterioration of the color purity and decrease in the efficiency. Therefore, improvement to eliminate these problems has been required.

An EL device having a construction in which a metal oxide is inserted between an anode and a transparent substrate was disclosed (Japanese Patent Application Laid-Open No. Heisei 4(1992)-334895). However, the layer of a metal oxide is formed with the object of shielding the organic layers of the EL from ultraviolet light which causes degradation of the organic layers. Therefore, this technology does not suggest the present invention.

An EL device having a construction of an anode/a hole injecting layer/a light emitting layer/an electron injecting layer/a cathode and using a mixed layer containing a specific metal complex and an organic compound different from the complex as the electron injecting layer, was also proposed (Japanese Patent Application Heisei 5(1993)-96407. However, optical thickness of the organic multi-layer part in this technology is not set at a value which enhances intensity of a selected wave length of the emitted EL light. Any suggestion for this particular point is not included, either.

It has been known that, in an EL device having a construction of a substrate/a multi-layer film of dielectrics/a transparent electrode/an organic multi-layer part/a cathode, color purity can be increased by controlling the total optical thickness of the transparent electrode and the organic multilayer part. However, this technology requires that the multi-layer film of dielectrics be used and it is inevitable that cost is increased.

On the other hand, there was disclosed a technology adopting a construction of a transparent electrode/a dielectrics layer/a fluorescent substance layer/a dielectrics layer/a back electrode and adjusting thickness (d) of a fluorescent substance layer or a laminate containing a fluorescent substance layer and a dielectrics layer and refractive index ($\eta$) to satisfy the equation: $d = k \cdot \eta \cdot \lambda/2$ ($\lambda$ being wave length of the emitted light) (Japanese Patent Application Laid-Open No. Heisei 2(1990)-46695). In this technology, an inorganic fluorescent substance, such as ZnS, is used as the fluorescent substance layer, and an insulation film containing an oxide and the like is used as the dielectrics layer. The thickness of the fluorescent substance layer or the laminate of the fluorescent substance layer and the dielectrics layer is adjusted in accordance with the refractive index in such a manner that the light emitted from the fluorescent substance layer is reflected multiple times between the interface between the transparent electrode and the dielectrics layer and the interface between the dielectrics layer and the back electrode, and the reflected lights interfered with each other. However, the interface between the transparent electrode and the dielectrics layer is treated as a reflecting interface in this construction because the refractive indices of the dielectrics layer and the fluorescent substance layer are 2.0 or more and the refractive index of the transparent electrode is about 1.8 or less. In contrast, thq refractive index of the organic multi-layer part is 1.6 to 1.8 in the construction of the transparent electrode/the organic multi-layer part/a cathode disclosed in the present invention. The interface of the transparent electrode and the organic multi-layer part cannot be treated as a reflecting interface. Japanese Patent Application Laid-Open No. Heisei 2(1990)-46695 described above does not suggest that the interface between the transparent electrode and the substrate, the interface between the transparent electrode and the underlayer of a high refractivity, or the interface between the transparent electrode and the underlayer of a low refractivity, can be treated as the reflecting interface, and the total optical thickness of the transparent electrode and the organic multi-layer part is controlled.

SUMMARY OF THE INVENTION

An object of the present invention is to provide an organic EL device having a specific construction in which the optical thickness from the anode to the cathode is controlled and the color purity of the blue light emission is particularly enhanced.

As the result of extensive studies by the present inventors to control the optical thickness and to develop an organic EL device having an enhanced color purity of the blue light emission, it was discovered that the object can be achieved by setting the following total optical thickness at a value which enhances intensity of a selected wave length of the EL light emitted from the organic multi-layer part having a specific refractive index: (1) in the construction of a substrate/a transparent electrode of a high refractivity/an organic multi-layer part/a cathode, the total optical thickness of the transparent electrode of a high refractivity and the organic multi-layer part; (2) in the construction of a substrate/an underlayer of a high refractivity/a transparent electrode/an organic multi-layer part/a cathode, the total optical thickness of the underlayer of a high refractivity, the transparent electrode, and the organic multi-layer part or the total optical thickness of the transparent electrode and the organic multi-layer part; and (3) in the construction of a substrate/a underlayer of a low refractivity/a transparent electrode/an organic multi-layer part/a cathode, the total optical thickness of the transparent electrode and the organic multi-layer part. The present invention has been completed on the basis of the discovery.

Accordingly, the present invention provides:

(1) Organic EL device [1] comprising a substrate, a transparent electrode of a high refractivity, an organic multi-layer part, and a cathode which are laminated in this order, wherein the total optical thickness of the transparent electrode of a high refractivity and the organic multi-layer part is set at a value which enhances the intensity of the central wave length $\lambda$ ($\lambda$ being selected in the ranges of 440 to 490 nm, 500 to 550 nm, and 600 to 650 nm) of the electroluminescence emitted from the organic multi-layer part having a refractive index of 1.6 to 1.8;

(2) Organic EL device [2] comprising a substrate, an underlayer of a high refractivity, a transparent electrode, an organic multi-layer part, and a cathode which are laminated in this order, wherein the total optical thickness of the underlayer of a high refractivity, the transparent electrode, and the organic multi-layer part is set at a value which enhances the intensity of the central wave length $\lambda$ ($\lambda$ being selected in the ranges of 440 to 490 nm, 500 to 550 nm, and 600 to 650 nm) of the electroluminescence emitted from the organic multi-layer part having a refractive index of 1.6 to 1.8;

(3) Organic EL device [3] comprising a substrate, an underlayer of a high refractivity, a transparent electrode, an organic multi-layer part, and a cathode which are laminated in this order, wherein the total optical thickness of the transparent electrode and the organic multi-layer part is set at a value which enhances the intensity of the central wave length $\lambda$ ($\lambda$ being selected in the ranges of 440 to 490 nm, 500 to 550 nm, and 600 to 650 nm) of the electroluminescence emitted from the organic multi-layer part having a refractive index of 1.6 to 1.8; and (4) Organic EL device [4] comprising a substrate, an underlayer of a low refractivity, a transparent electrode, an organic multi-layer part, and a cathode which are laminated in this order, wherein the total optical thickness of the transparent electrode and the organic multi-layer part is set at a value which enhances the intensity of the central wave length $\lambda$ ($\lambda$ being selected in the ranges of 440 to 490 nm, 500 to 550 nm, and 600 to 650 nm) of the electroluminescence emitted from the organic multi-layer part having a refractive index of 1.6 to 1.8.

DESCRIPTION OF PREFERRED EMBODIMENTS

Figure 1:
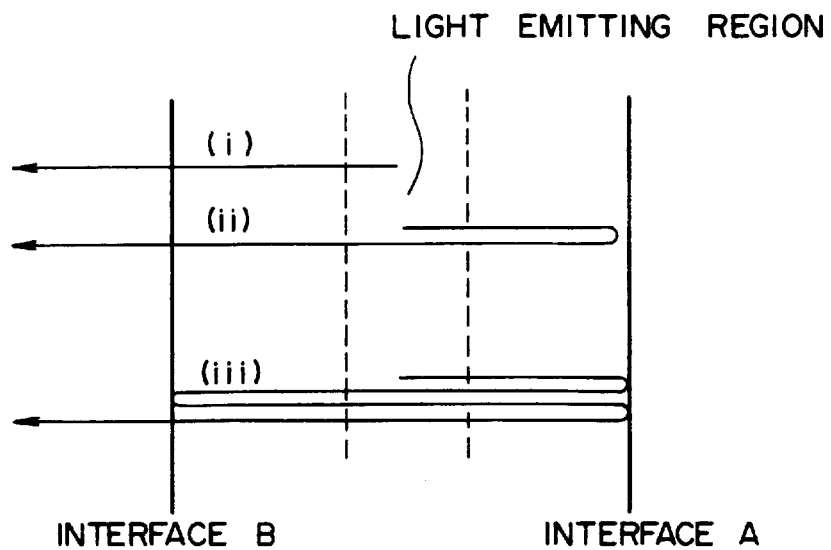
FIG. 1 shows a chart explaining various modes of emission of the EL light emitted from the organic multi-layer part.

Organic EL device [1] of the present invention has the construction of a substrate/a transparent electrode of a high refractivity/an organic multi-layer part/a cathode. As the substrate, a material having transparency, such as glass, quartz, organic macromolecular compounds, and the like, can be used. Among these materials, a material having a refractive index of 1.6 or lower is preferable. For the transparent electrode of a high refractivity, it is preferable that a material having a refractive index as high as possible is used in order to reflect light at the interface of the substrate of a low refractivity having a refractive index of 1.6 or less and the transparent electrode. The transparent electrode of a high refractivity preferably has a refractive index of 1.8 or higher, more preferably 1.9 or higher. It is preferred that a material having a refractive index of 1.8 or higher, preferably 1.9 or higher, is suitably selected from dielectric transparent materials having a large work function (4 eV or more), such as indium tin oxide (ITO), ZnO, SnO2, CuI, and the like, and used as the electrode material for the transparent electrode of a high refractivity.

The transparent electrode of a high refractivity can be prepared by forming a thin layer of the electrode material on a substrate by a method such as the vapor deposition and the sputtering. To obtain light emission from the electrode, it is preferable that transmittance of the electrode is more than 10% and resistance of the sheet as the electrode is preferably several hundred $\Omega/\square$ or less.

As the organic multi-layer part, various types of conventional materials can be used as described later.

The cathode is a layer having the mirror property. The layer reflects preferably 50% or more, more preferably 70% or more, of the light emitted from the organic multi-layer part. As the cathode material, a material having a small work function (4 eV or less) is suitably selected from a metal, an alloy, an electric conductive compound, and a mixture of these materials, and used as the cathode material. Specific examples of such cathode material include sodium, sodium-potassium alloys, magnesium, lithium, magnesium-silver alloys, Al/Al$_2$O$_3$, indium, rare earth metals, and the like. The cathode can be prepared by forming these cathode materials into a thin layer by a method such as the vapor deposition and the sputtering. Resistance of the sheet as the electrode is preferably several hundred $\Omega/\square$ or less. Thickness of the film is preferably in the range of 10 nm to 1 $\mu$m, more preferably in the range of 50 to 200 nm.

In organic EL device [1] of the present invention, it is necessary that the total optical thickness of the transparent electrode of a high refractivity and the organic multi-layer part described above be set at a value which enhances intensity of the central wave length $\lambda$ of the light emitted from the organic multi-layer part having a refractive index of 1.6 to 1.8. The central wave length $\lambda$ is selected in the range of 440 to 490 nm when emission of blue light is desired, in the range of 500 to 550 nm when green light emission is desired, and in the range of 600 to 650 nm when red light emission is desired.

In other words, when the optical thickness of the organic multi-layer part is indicated by $(nd)_1$ and the optical thickness of the transparent electrode of a high refractivity is indicated by $(nd)_2$, the total optical thickness of the transparent electrode of a high refractivity and the organic multi-layer part $[(nd)_1+(nd)_2]$ is generally set to a value which satisfies the relation expressed by the equation:

$$4\pi/\lambda[(nd)_1+(nd)_2]=2m\pi \qquad (I)$$

or $$4\pi/\lambda[(nd)_1+(nd)_2]=(2m-1)\pi \qquad (II)$$

In equations (I) and (II), m indicates an integer of 1 to 10, n indicates the refractive index of the respective part, d indicates the thickness of the respective part, and $\lambda$ is the same as that described above. Either one is selected from equations (I) and (II) in accordance with the refractive index of the cathode metal. For example, when (the refractive index of the organic multi-layer part)<(the refractive index of the cathode metal), equation (II) is selected. When the relation is reversed, equation (I) is selected. When the refractive index of the cathode metal is not known in advance, a device can be actually prepared and tested to find the proper relation. The optical thickness of individual layer can be obtained as the product of the thickness and the refractive index of the layer.

When the total optical thickness of the transparent electrode of a high refractivity and the organic multi-layer part is set to a value which satisfies the above relation, such a remarkable effect is exhibited that the intensity of the central wave length of the EL light emitted from the device is enhanced and the color purity is improved. When this excellent effect is exhibited, color of the organic EL device becomes clear and can be used for exhibiting any of R, G, and B which are the elements of the full color.

Organic EL devices [2] and [3] of the present invention have the construction of a substrate/a underlayer of a high refractivity/a transparent electrode/an organic multi-layer part/a cathode. The substrate, the organic multi-layer part, and the cathode which are the same as those described in organic EL device [1], can be used. The underlayer of a high refractivity is a substantially transparent layer having a high refractive index of 1.8 or more, and is preferably a layer comprising a conventional optically transparent dielectrics, such as a layer of an oxide having a refractive index of 2.0 or more, like TiO$_2$, ZrO$_2$, ZnO, SiO, Sc$_2$O$_3$, HfO$_2$, CeO$_2$, and the like. A layer comprising ZnS, ZnSSe, ZnTe, GaN, InGaN, AlN, BeN, or the like, can be favorably used as well.

As the transparent electrode, an electrode using a dielectric transparent material described in the examples of the transparent electrode of a high refractivity in organic EL device [1] as the electrode material, can be used. It is advantageous that the electrode has a refractive index of 1.8 or higher.

In organic EL device [2] of the present invention, reflection of the light takes place at the interface of the substrate and the underlayer of a high refractivity. Therefore, it is necessary that the total optical thickness of the underlayer of a high refractivity, the transparent electrode, and the organic multi-layer part be set to a value which enhances intensity of the central wave length $\lambda$ ($\lambda$ being the same as that described above) of the light emitted from the organic multi-layer part having a refractive index of 1.6 to 1.8.

In other words, when the optical thickness of the organic multi-layer part is indicated by $(nd)_1$, the optical thickness of the transparent electrode is indicated by $(nd)_3$, and the optical thickness of the underlayer of a high refractivity is indicated by $(nd)_4$, the total optical thickness of these layers $[(nd)_1+(nd)_3+(nd)_4]$ is generally set to a value which satisfies the relation expressed by the equation:

$$4\pi/\lambda[(nd)_1+(nd)_3+(nd)_4]=2m\pi \qquad (III)$$

or $$4\pi/\lambda[(nd)_1+(nd)_3+(nd)_4]=(2m-1)\pi \qquad (IV)$$

wherein $\lambda$, m, n, and d are the same as those described above.

Either one is selected from equations (III) and (IV) in accordance with the refractive index of the cathode metal in a similar manner to organic EL device [1].

In organic EL device [3], reflection of the light takes place at the interface of the underlayer of a high refractivity and the transparent electrode. Therefore, it is necessary that the total optical thickness of the transparent electrode and the organic multi-layer part be set to a value which enhances intensity of the central wave length $\lambda$ ($\lambda$ being the same as that described above) of the light emitted from the organic multi-layer part having a refractive index of 1.6 to 1.8.

In other words, when the optical thickness of the organic multi-layer part is indicated by $(nd)_1$ and the optical thickness of the transparent electrode is indicated by $(nd)_3$, the total optical thickness of these layers $[(nd)_1+(nd)_3]$ is generally set to a value which satisfies the relation expressed by the equation:

$$4\pi/\lambda[(nd)_1+(nd)_3]=2m\pi \qquad (V)$$

or $$4\pi/\lambda[(nd)_1+(nd)_3]=(2m-1)\pi \quad \text{(VI)}$$

wherein $\lambda$, m, n, and d are the same as those described above.

Either one is selected from equations (V) and (VI) in accordance with the refractive index of the cathode metal in a similar manner to organic EL device [1]. However, when (the refractive index of the organic multi-layer part)<(the refractive index of the metal), equation (V) is selected and, when the relation is reversed, equation (VI) is selected.

In some cases, the reflection takes place at both of the interface of the underlayer of a high refractivity and the transparent electrode and the interface of the substrate and the underlayer of a high refractivity. For example, this type of reflection takes place when the refractive indices of the layers have the relation: (the refractive index of the transparent electrode)<(the refractive index of the underlayer of a high refractivity)>(the refractive index of the substrate), and the differences between the refractive indices are large. In this case, the optical thickness is set to a value which satisfies the relation expressed by the equations:

$$4\pi/\lambda_1[(nd)_1+(nd)_3]=(2m-1)\pi \quad \text{(VII)}$$

$$4\pi/\lambda_2[(nd)_1+(nd)_3+(nd)_4]=2m\pi \quad \text{(VIII)}$$

wherein $\lambda$, m, n, and d are the same as those described above. In equations (VII) and (VIII), $\lambda_1$ and $\lambda_2$ are generally selected in the range of 440 to 490 nm when emission of blue light is desired, in the range of 500 to 550 nm when emission of green light is desired, and in the range of 600 to 650 nm when emission of red light is desired. It is not necessary that the values of $\lambda_1$ ad $\lambda_2$ be the same. Equations (VII) and (VIII) are applied to the case in which the refractive indices have the relation: (the refractive index of the organic multi-layer part)>(the refractive index of the cathode), in a similar manner to organic EL device [1] described above. When this relation of the refractive indices are reversed, the total optical thickness is set to a value satisfying the relation expressed by the equations:

$$4\pi/\lambda_1[(nd)_1+(nd)_3]=2m\pi \quad \text{(IX)}$$

$$4\pi/\lambda_2[(nd)_1+(nd)_3+(nd)_4]=(2m+1)\pi \quad \text{(X)}$$

Either one of the combination of equations (VII)/(VIII) and the combination of equations (IX)/(X) are selected because the phase of the light changes by $\pi$ when the light comes from a layer of a low refractivity and reflected into a layer of a low refractivity, but the change in the phase of the light is 0 in the case of the reverse relation. This change in the phase of the light must naturally be taken into consideration for setting the optical thickness described above.

Particularly, when $\lambda_1=\lambda_2$, $(nd)_4=\lambda/4$. In this case, the enhancement of the intensity of the central wave length of the light is particularly large, and it is not necessary to apply a conventional method for improving the color purity, such as (1) a method of improving the color purity by a color filter, and (2) a method of improving the color purity by placing a multi-layer film of a dielectrics and the mirror surface of the cathode on both sides of the organic multi-layer part. It is apparent that the constructions of organic EL devices [2] and [3] are simpler than those adopted in the methods (1) and (2).

Organic EL device [4] of the present invention has the construction of a substrate/an underlayer of a low refractivity/a transparent electrode/an organic multi-layer part/a cathode. The substrate, the organic multi-layer part, and the cathode which are the same as those described in organic EL device [1], can be used. As the transparent electrode, an electrode using a dielectric transparent material described in the examples of the transparent electrode of a high refractivity in organic EL device [1] as the electrode material, can be used. It is advantageous that the electrode has a refractive index of 1.8 or higher.

For the underlayer of a low refractivity, a material having a low refractive index can be suitably selected from conventional dielectric materials and used. For example, a layer comprising a metal fluoride such as $CaF_2$, $MgF_2$, LiF, and the like, has a refractive index of 1.4 or less and can be advantageously used. A layer comprising a polymer containing fluorine, such as a fluorinated acrylic resin and a copolymer like Teflon or a derivative thereof, is also preferable.

In organic EL device [4] described above, reflection of the light takes place at the interface of the underlayer of a low refractivity and the transparent electrode. Therefore, it is necessary that the total optical thickness of the transparent electrode and the organic multi-layer part be set to a value which enhances intensity of the central wave length $\lambda$ ($\lambda$ being the same as that described above) of the light emitted from the organic multi-layer part having a refractive index of 1.6 to 1.8.

In other words, when the optical thickness of the organic multi-layer part is indicated by $(nd)_1$ and the optical thickness of the transparent electrode is indicated by $(nd)_3$, the total optical thickness of these layers $[(nd)_1+(nd)_3]$ is generally set to a value which satisfies the relation expressed by the equation:

$$4\pi/\lambda[(nd)_1+(nd)_3]=2m\pi \quad \text{(V)}$$

or $$4\pi/\lambda[(nd)_1+(nd)_3]=(2m-1) \quad \text{(VI)}$$

wherein $\lambda$, m, n, and d are the same as those described above.

Either one is selected from equations (V) and (VI) in accordance with the refractive index of the cathode metal in a similar manner to organic EL device [1].

The principle of working of organic EL devices [1] to [4] of the present invention is described in the following.

Electrons injected from the cathode and holes injected from the anode are combined to each other and an excited state of the molecule or the polymer of the light emitting material is formed. The excited state returns to the ground state by emitting light. The emitted light includes various types of light, such as (i) light coming out from the transparent side of interface B, (ii) light reflected at interface A and then coming out, (iii) light reflected at interface B, then reflected at interface A, and coming out, and the like other lights. Actually, these lights interfere with each other and the so-called multiple interference in the form of Fabry-Perot interference takes place. As the result of these interferences, in the device which satisfies the conditions of the optical thickness described above, the light having a wave length $\lambda$ ($\lambda$ being the same as that described above) is emitted with an enhanced intensity and the color purity of the emitted light is improved.

Interface A is the interface between the cathode having the metallic mirror surface and the organic multi-layer part. There are four types of interface in interface B in accordance with the construction of the device as shown in the following:

(1) the interface between the substrate and the transparent electrode of a high refractivity in the case of organic EL device [1].

(2) the interface between the substrate and the underlayer of a high refractivity in the case of organic EL device [2].

(3) the interface between the underlayer of a high refractivity and the transparent electrode in the case of organic EL device [3].

(4) the interface between the underlayer of a low refractivity and the transparent electrode in the case of organic EL device [4].

It is preferred that difference in the refractive indices at interface B (difference in the refractive indices between the layers at the both sides of interface B) is larger. The range of the difference which can be substantially selected is preferably 0.2 to 1.5.

The present invention does not mean that a multi-layer construction containing a repeated structure of a high refractivity layer and a low refractivity layer can be used as interface B. This type of construction is not only complicated to cause difficulty in the production of uniform products, but also has another drawback in that the central wave length varies to a large degree depending on the angle of observation even though the color purity can be improved by the increased selection of the wave length. Therefore, it is difficult to adopt this type of construction in a display device having a large surface area.

In contrast, the organic EL device of the present invention has a remarkable property that dependency of the light intensity on the angle of observation is small and, furthermore, has the useful property that the color purity is increased.

Examples of the construction of the organic multi-layer part in organic EL devices [1] to [4] of the present invention include the following constructions, in which the layers are listed from the side of the transparent electrode to the side of the cathode:

(1) a layer of a hole transporting region/a light emitting layer (2) a layer of a hole transporting layer/a light emitting layer/an electron injecting layer (3) a light emitting layer/an electron injecting layer (4) an organic semiconducting layer/a light emitting layer (5) an organic semiconducting layer/an electron barrier layer/a light emitting layer (6) a layer of a hole transporting region/a light emitting layer/a layer for improving adhesion.

Among these constructions, the construction of a layer of a hole transporting region/a light emitting layer, the construction of a layer of a hole transporting region/a light emitting layer/an electron injecting layer, and the construction of a layer of a hole transporting layer/a light emitting layer/a layer for improving adhesion, are preferable.

In the organic multi-layer part having the construction described above of the present invention, it is advantageous that the intensity of the central wave length λ (λ being the same as that described above) of the EL light emitted from the organic multi-layer part is enhanced by suitably selecting the thickness of the layer of a hole transporting region or the light emitting layer.

In the present invention, the refractive indices of the layers in the organic multi-layer part may be different from one another but it is necessary that they be in the range of 1.6 to 1.8. Reflection at the interface of the transparent electrode and the organic multi-layer part is small because of the small difference in the refractive indices between the transparent electrode and the organic multi-layer part. Therefore, the reflection at this interface is not utilized in the present invention.

The light emitting layer in the organic multi-layer part described above is a layer having (a) the function of injection (on application of a voltage, holes can be injected from the anode or the layer of a hole transporting region, and electrons can be injected from the anode or the electron injecting layer), (b) the function of transportation (holes and electrons can be transported by the force of an electric field.), and (c) the function of light emission (the field for recombination of a hole and an electron is provide and light can be emitted), similarly to an ordinary light emitting layer. Thickness of this layer is not particularly limited but suitably selected in accordance with the situation. The thickness is preferably 1 nm to 10 μm, more preferably 5 nm to 5 μm.

Examples of the preferable light emitting material (the host material) include:

a compound represented by the general formula (XI):

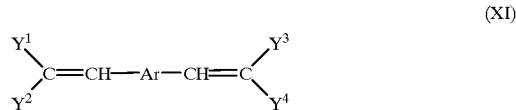

(XI)

[wherein, $Y^1$ to $Y^4$ indicate each a hydrogen atom, an alkyl group having 1 to 6 carbon atoms, an alkoxy group having 1 to 6 carbon atoms, an aralkyl group having 7 to 8 carbon atoms, a substituted or unsubstituted aryl group having 6 to 18 carbon atoms, a substituted or unsubstituted cyclohexyl group, or a substituted or unsubstituted aryloxy group having 6 to 18 carbon atoms;

therein the substituent is an alkyl group having 1 to 6 carbon atoms, an alkoxy group having 1 to 6 carbon atoms, an aralkyl group having 7 to 8 carbon atoms, an aryloxy group having 6 to 18 carbon atoms, an acyl group having 1 to 6 carbon atoms, an acyloxy group having 1 to 6 carbon atoms, carboxyl group, styryl group, an arylcarbonyl group having 6 to 20 carbon atoms, an aryloxycarbonyl group having 6 to 20 carbon atoms, an alkoxycarbonyl group having 1 to 6 carbon atoms, vinyl group, anilinocarbonyl group, carbamoyl group, phenyl group, nitro group, hydroxyl group or a halogen atom; number of the substituent may be one or plural;

$Y^1$ to $Y_4$ may be identical to or different from one another; $Y^1$ and $Y_2$, and $Y^3$ and $Y^4$, may be combined through substituents in one or both of them to form a substituted or unsubstituted saturated or unsaturated five-membered ring or a substituted or unsubstituted saturated or unsaturated six-membered ring;

Ar indicates a substituted or unsubstituted arylene group having 6 to 20 carbon atoms; the arylene group therein may be mono-substituted or poly-substituted and its positions may be any of ortho-, para- and meta-; and, when Ar is an unsubstituted phenylene group, $Y^1$ to $Y^4$ are each a group selected from the group consisting of an alkoxy group having 1 to 6 carbon atoms, an aralkyl group having 7 to 8 carbon atoms, and a substituted or unsubstituted naphthyl group, biphenyl group, cylclohexyl group and an aryloxy group.];

a compound represented by the general formula (XII):

(XII)

[wherein A and B indicate each a monovalent group having a structure obtained by removing one hydrogen atom from the compound represented by the general formula (XI) described above and may be identical to or different from each other, and Q indicates a divalent group breaking a conjugation.]; or a compound represented by the general formula (XIII):

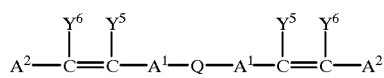

(XIII)

[wherein $A^1$ indicates a substituted or unsubstituted arylene group having 6 to 20 carbon atoms or a substituted or unsubstituted divalent aromatic heterocyclic group and its bonding positions may be any of ortho- para- and meta-; $A^2$ indicates a substituted or unsubstituted aryl group having 6 to 20 carbon atoms or a substituted or unsubstituted monovalent aromatic heterocyclic group; and $Y^5$ and $Y^6$ indicate each a hydrogen atom, a substituted or unsubstituted aryl group having 6 to 20 carbon atoms, cyclohexyl group, a monovalent aromatic heterocyclic group, an alkyl group having 1 to 10 carbon atoms, an aralkyl group having 7 to 20 carbon atoms, or an alkoxy group having 1 to 10 carbon atoms, and may be identical to or different from each other; therein the substituent is an alkyl group, an aryloxy group, amino group or a substituted or unsubstituted phenyl group when the group has one substituent;

each substituents in $Y^5$ may combine with $A^1$ to form a saturated or unsaturated five-membered or six-membered ring; each substituents in $Y^6$ may combine with $A^2$ to form a saturated or unsaturated five-membered or six-membered ring; and $Q^1$ indicates a divalent group breaking a conjugation.].

In general formulae (XII) and (XIII), Q indicates a divalent group breaking a conjugation. The conjugation therein is attributed to delocalization of π-electrons. It includes conjugated double bonds and a conjugation due to unpaired electrons or lone pair electrons. Specific examples of Q include:

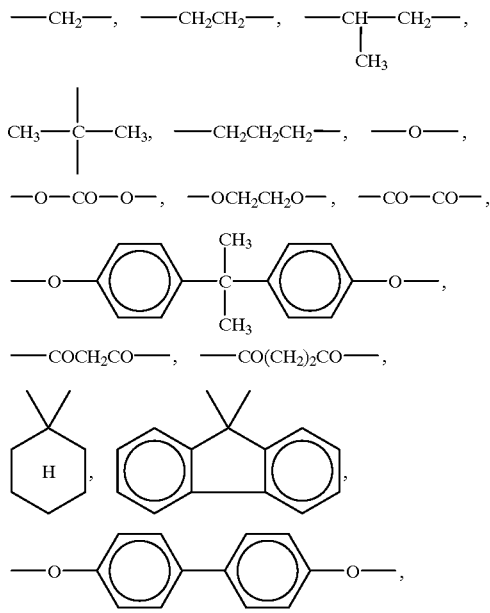

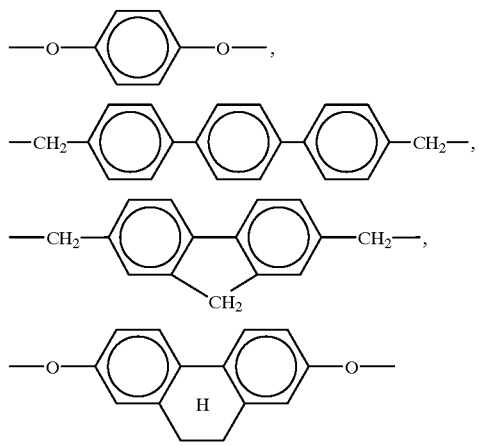

The divalent group breaking a conjugation is used for the purpose of keeping the color of the EL emission light obtained by using the compound represented by general formula (XII) in the organic EL device of the present invention, identical to the color of the EL emission light obtained by using one of the compounds forming A and B (the compound represented by the general formula (XI)) singly in the organic EL device of the present invention. In other words, the divalent group is used for the purpose of avoiding shift of wave length of light from the light emitting layer using a compound represented by the general formula (XI) or the general formula (XII) to a shorter or longer wave length. When groups A and B are combined through the divalent group breaking a conjugation, it is confirmed that the glass transition temperature (Tg) rises, uniform pinhole-free micro-crystalline or amorphous thin layer can be obtained, and uniformity of the light emission is improved. Furthermore, when groups A and B are combined through the divalent group breaking a conjugation, advantages are found in that shift of the EL emission light to a longer wave length can be avoided, and that synthesis or purification can be easily conducted.

Other preferable examples of the light emitting material (the host material) include metal complexes of 8-hydroxyquinolinol and derivatives thereof. More specific examples include metal chelated oxinoid compounds including chelates of oxine (generally, 8-quinolinol or 8-hydroxyquinolinol). These compounds exhibit properties of a high level and are easily formed into a thin layer. Examples of the oxinoid compound are compounds satisfying the following formula:

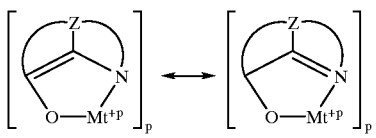

[wherein, Mt indicates a metal, p indicates an integer of 1 to 3 and Z indicates an atom which is located independently and necessary for completing at least two condensed aromatic rings.

The metal represented by Mt is a monovalent, divalent or trivalent metal. Examples thereof include an alkali metal, such as lithium, sodium, potassium, and the like, an alkaline earth metal, such as magnesium, calcium, and the like, or an earth metal, such as boron, aluminum, and the like.

Any of monovalent, divalent and trivalent metals which are generally known to form useful chelated compounds can be used.

Z indicates an atom which forms a hetero-ring of azole or azine as one of at least two condensed aromatic rings. If necessary, another ring can be added to above-mentioned condensed aromatic ring. Moreover, in order to avoid adding bulky molecule without improvement in the function, the number of the atom indicated by Z is preferably kept to 18 or less.

Specific examples of the chelated oxinoid compound include tris(8-quinolinol) aluminum, bis(8-quinolinol) magnesium, bis(benzo-8-quinolinol) zinc, bis(2-methyl-8-quinolilato) aluminum oxide, tris(8-quinolinol) indium, tris (5-methyl-8-quinolinol) aluminum, 8-quinolinol lithium, tris(5-chloro-8-quinolinol)gallium, bis(5-chloro-8-quinolinol) calcium, 5,7-dichloro-8-quinolinol aluminum, tris(5,7-dibromo-8-hydroxyquinolinol)aluminum, and the like.

The light emitting layer described above can be prepared by forming a thin layer by a known method, such as the vapor deposition method, the spin-coating method, the casting method, the LB method and the like. It is particularly preferred that the light emitting layer is a molecular accumulated film. A molecular accumulated film is a thin film formed by depositing a compound from a gaseous state, or a thin film formed by solidification of a compound from a solution or a liquid state. Usually, the molecular accumulated film is distinguished from a thin film formed by the LB method (a molecular built-up film) by the difference in aggregation structure or the higher-order structure, or the functional difference resulting therefrom.

The light emitting layer described above can also be formed by dissolving the material into a solvent together with a binding material such as a resin to form a solution, and then forming the mixed material into a thin layer by a method like the spin coating method.

Examples of the material of the light emitting layer represented by the general formulae (XI) to (XIII) described above include the following compounds:

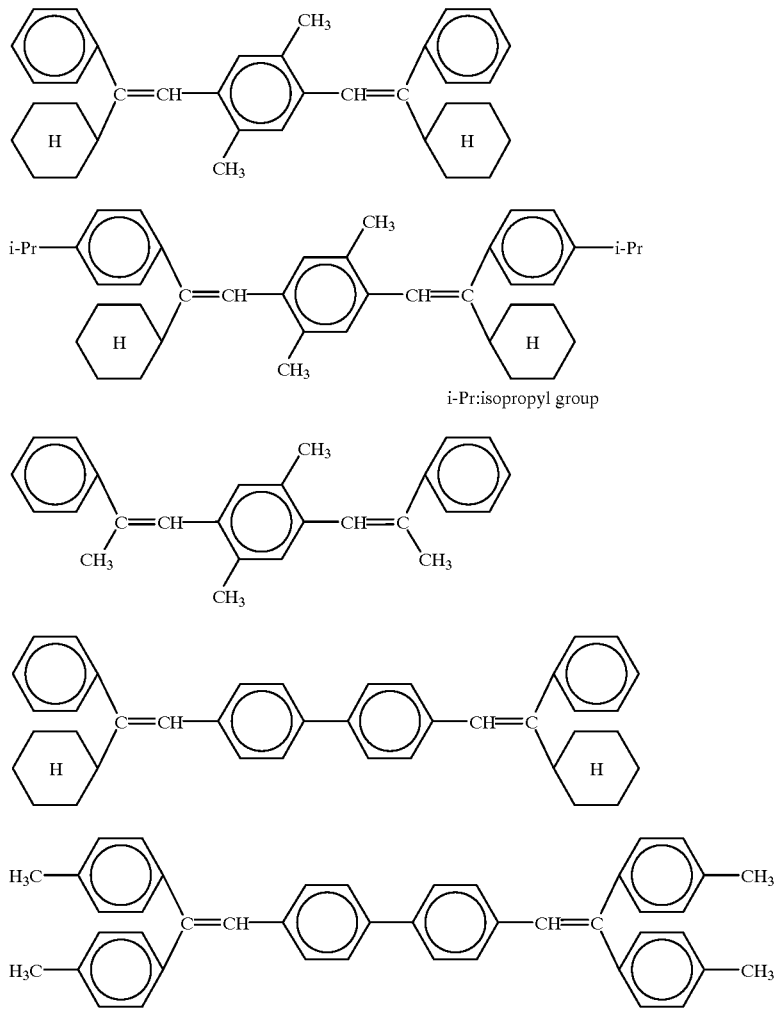

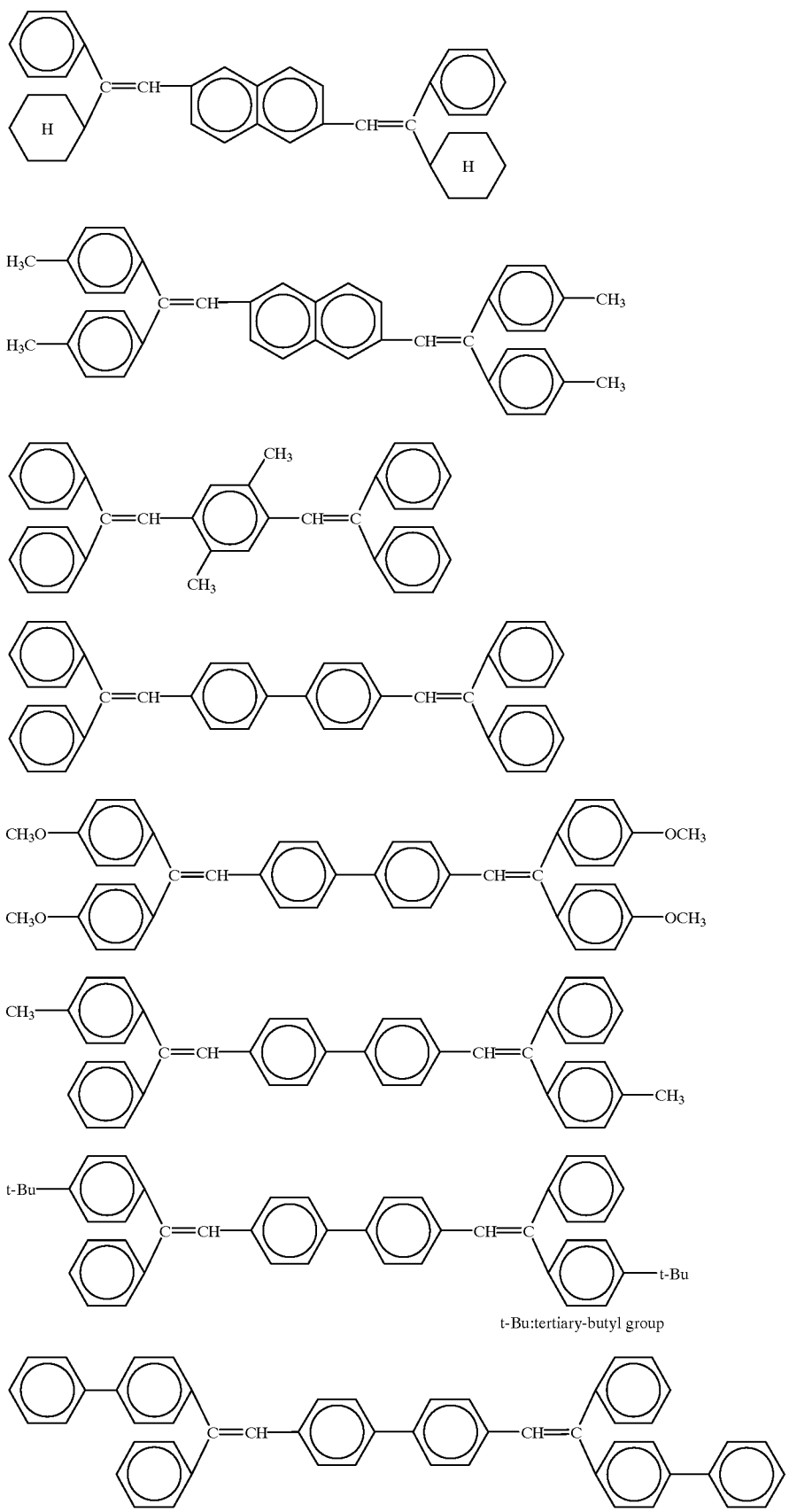

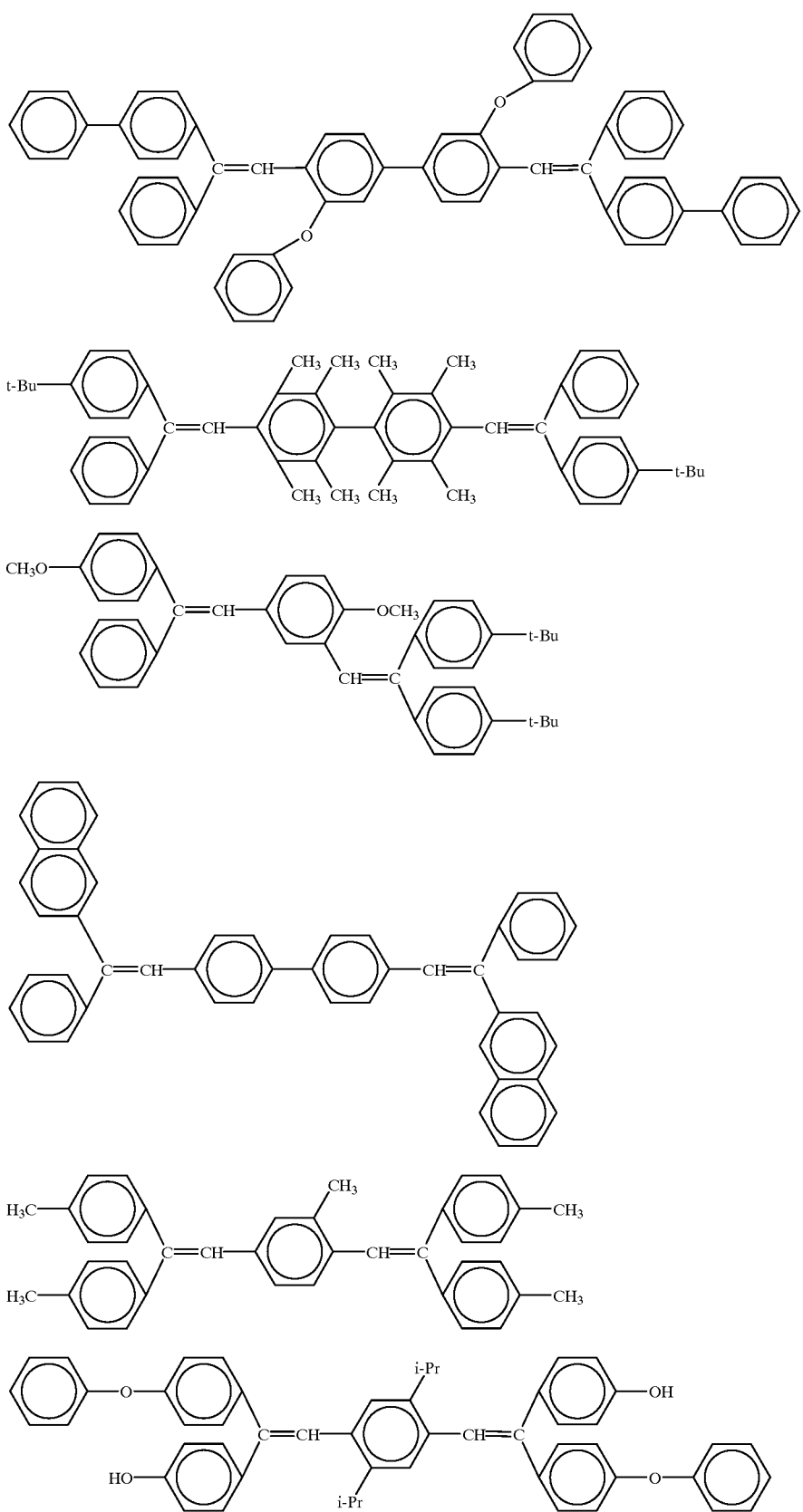

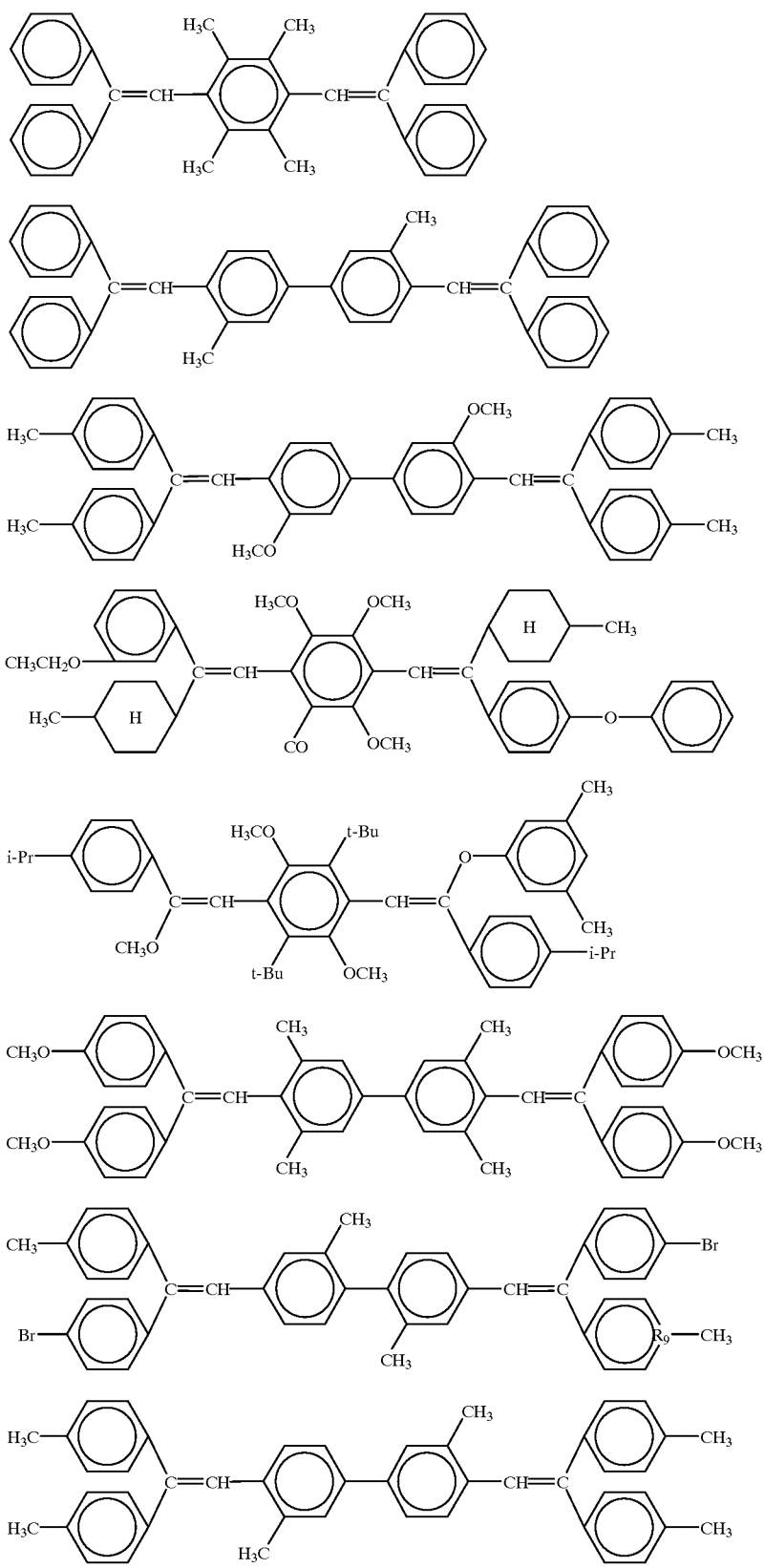

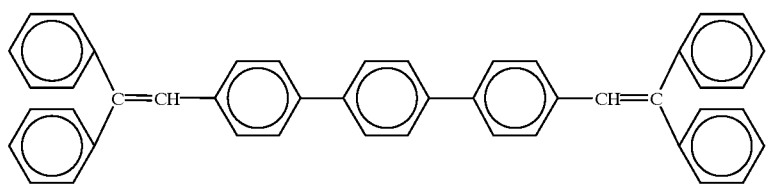
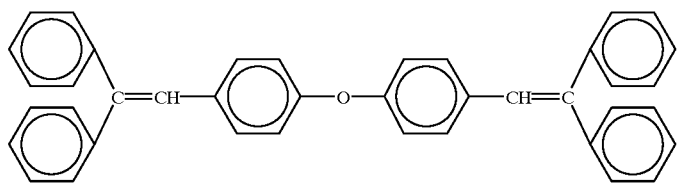
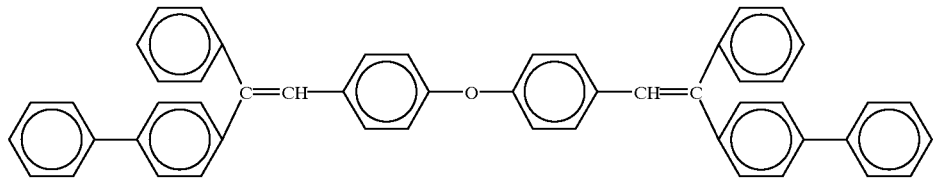
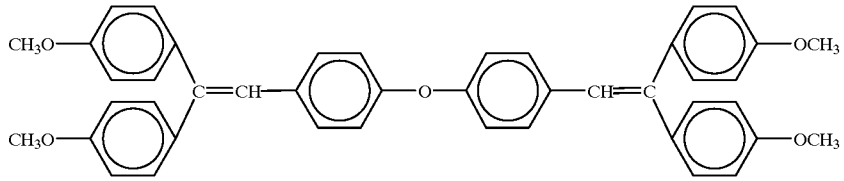
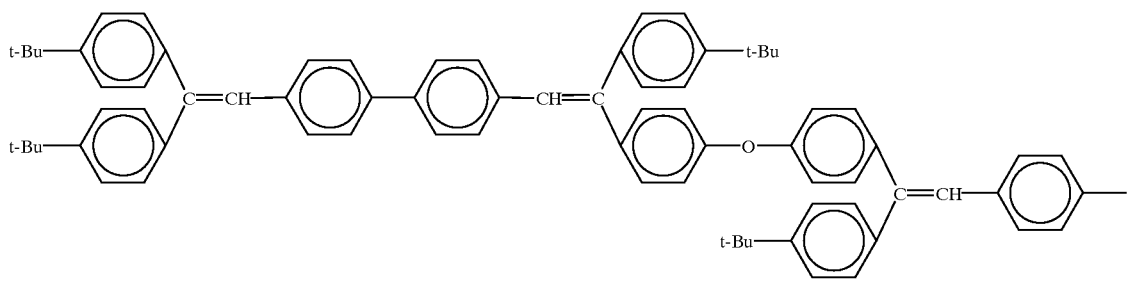
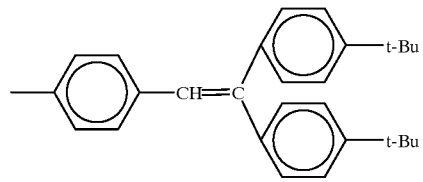
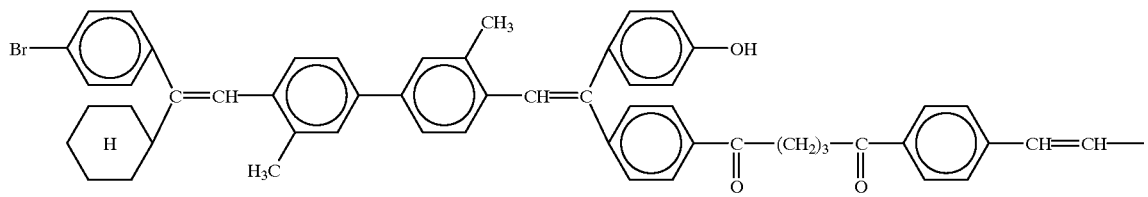
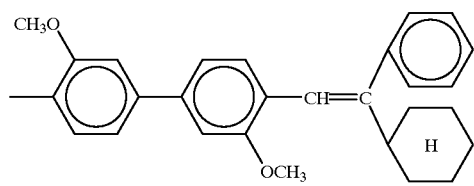

-continued

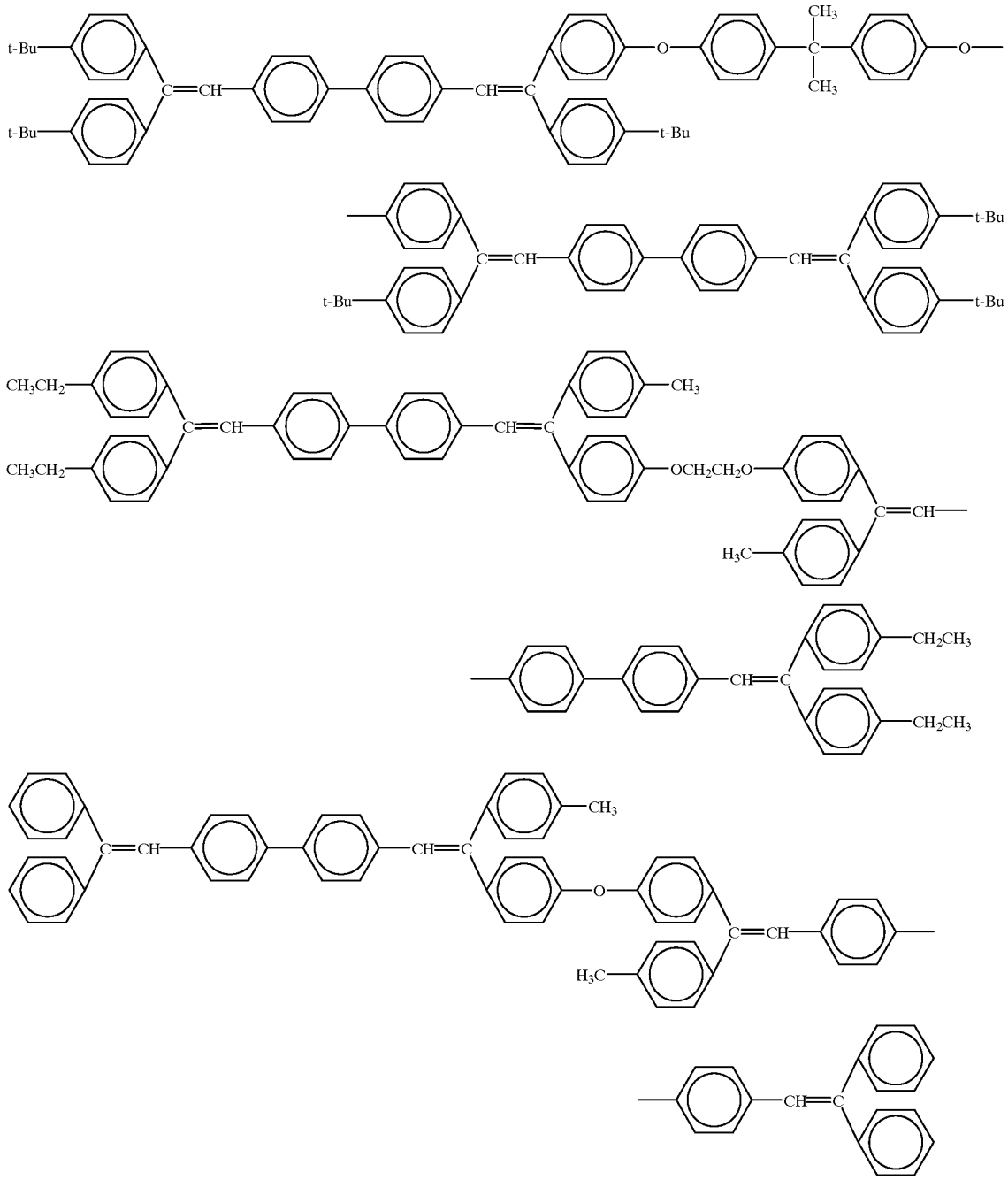

The layer of the hole transporting region is not necessary required for the present device, but preferably used for the purpose of improving the light emission ability. The preferable material of the layer of the hole transporting region is a material which transports holes to the light emitting layer at a lower electric field. It is more preferable that mobility of holes is at least $10^{-6}$ cm$^2$/volt·sec in an electric field of $10^4$ to $10^6$ volt/cm. The electron barrier layer may be used between the light emitting layer and the anode (the transparent electrode) for the purpose of holding electrons in the light emitting region.

Material of the hole transporting region is not particularly limited as long as the material has the preferable properties described above. A material can be selected and used according to desire from conventional materials used as charge transporting materials of holes in photoconductive materials and generally known materials used as a layer of the hole transporting region in EL devices.

Examples of the material for the hole transporting region include: triazole derivatives (described in the specification of U.S. Pat. No. 3,112,197, etc.); oxadiazole derivatives (described in the specification of U.S. Pat. No. 3,189,447, etc.); imidazole derivatives (described in Japanese Patent Publication No. Showa 37(1962)-16096, etc.); polyarylalkane derivatives (described in the specifications of U.S. Pat. Nos. 3,615,402, 3,820,989 and 3,542,544; in Japanese Patent Publication Nos. Showa 45(1970)-555 and Showa 51(1976)-10983, in Japanese Patent Application Laid-Open Nos. Showa 51(1976)-93224, Showa 55(1980)-17105, Showa 56(1981)-4148, Showa 55(1980)-108667, Showa 55(1980)-156953, Showa 56(1981)-36656, etc.); pyrazoline derivatives and pyrazolone derivatives (described in the specifications of U.S. Pat. Nos. 3,180,729 and 4,278,746, in Japanese Patent Application Laid-Open Nos. Showa 55(1980)-88064, Showa 55(1980)-88065, Showa 49(1974)-105537, Showa 55(1980)-51086, Showa 56(1981)-80051, Showa 56(1981)-88141, Showa 57(1982)-45545, Showa 54(1979)-112637, Showa 55(1980)-74546, etc.); phenylenediamine derivatives (described in the specification of U.S. Pat. No. 3,615,404, in Japanese Patent Publication Nos. Showa 51(1976)10105, Showa 46(1971)-3712, and Showa 47(1972)-25336, in Japanese Patent Application Laid-Open Nos. Showa 54(1979)-53435, Showa 54(1979)-110536, Showa 54(1979)-119925, etc.); arylamine derivatives (described in the specifications of U.S. Pat. Nos. 3,567,450, 3,180,703, 3,240,597, 3,658,520, 4,232,103, 4,175,961, and 4,012,376, in Japanese Patent Publication Nos. Showa 49(1974)-35702 and Showa 39(1964)-27577, in Japanese Patent Application Laid-Open Nos. Showa 55(1980)-144250, Showa 56(1981)-119132, and Showa 56(1981)-22437, in West German Patent No. 1,110,518, etc.); amino-substituted chalcone derivatives (described in the specification of U.S. Pat. No. 3,526,501, etc.); oxazole derivatives (described in the specification of U.S. Pat. No. 3,257,203, etc.); styrylanthracene derivatives (described in Japanese Patent Application Laid-Open No. Showa 56(1981)-46234); fluorenone derivatives (described in Japanese Patent Application Laid-Open No. Showa 54(1979)-110837, etc.); hydrazone derivatives (described in the specification of U.S. Pat. No. 3,717,462; in Japanese Patent Application Laid-Open Nos. Showa 54(1979)-59143, Showa 55(1980)-52063, Showa 55(1980)-52064, Showa 55(1980)-46760, Showa 55(1980)-85495, Showa 57(1982)-11350, Showa 57(1982)-148749, etc.); and stilbene derivatives (described in Japanese Patent Application Laid-Open Nos. Showa 61(1986)-210363, Showa 61(1986)-228451, Showa 61(1986)-14642, Showa 61(1986)-72255, Showa 62(1987)-47646, Showa 62(1987)-36674, Showa 62(1987)-10652, Showa 62(1987)-30255, Showa 60(1985)-93445, Showa 60(1985)-94462, Showa 60(1985)-174749, Showa 60(1985)-175052, etc.).

Other examples of the material for the hole transporting region include: silazane derivatives (described in the specification of U.S. Pat. No. 4,950,950); polysilane based materials (described in Japanese Patent Application Laid-Open No. Heisei 2(1990)-204996); aniline-based copolymers (described in Japanese Patent Application Laid-Open No. Heisei 2(1990)-282263); and electric conductive polymeric oligomers (described in Japanese Patent Application Laid-Open No. Heisei 1(1989)-211399), particularly thiophene oligomers.

In the present invention, the above compounds can be used as the material of the hole transporting region, but it is preferred that porphyrin compounds (described in Japanese Patent Application Laid-Open No. Showa 63(1988)-295695, etc.), and aromatic tertiary amine compounds and styrylamine compounds (described in the specification of U.S. Pat. No. 4,127,412; in Japanese Patent Application Laid-Open Nos. Showa 53(1978)-27033, Showa 54(1979)-58445, Showa 54(1979)-149634, Showa 54(1979)-64299, Showa 55(1980)-79450, Showa 55(1980)-144250, Showa 56(1981)-119132, Showa 61(1986)-295558, Showa 61(1986)-98353 and Showa 63(1988)-295695, etc.), which are shown specifically in the following, are used. It is more preferable that the aromatic tertiary amine compound is used.

Representative examples of the porphyrin compound include: porphin, 1,10,15,20-tetraphenyl-21H,23H-porphin copper (II), 1,10,15,20-tetraphenyl-21H,23H-porphin zinc (II), 5,10,15,20-tetrakis(pentafluoro-phenyl)-21H,23H-porphin, silicon phthalocyanine oxide, aluminum phthalocyanine chloride, phthalocyanine (no metal), dilithium phthalocyanine, copper tetramethylphthalocyanine, copper phthalocyanine, chromium phthalocyanine, zinc phthalocyanine, lead phthalocyanine, titanium phthalocyanine oxide, magnesium phthalocyanine, copper octamethylphthalocyanine, and the like.

Representative examples of the aromatic tertiary amine compound and the styrylamine compound include: N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolyl-aminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4(di-p-tolylamino)styryl]stilbene, 4-N,N-diphenyl-amino-(2-diphenylvinyl)benzene, 3-methoxy-4'-N,N-diphenylamino-stilbene, N-phenylcarbazole, aromatic dimethylidine compounds, and the like.

The layer of the hole transporting region in the EL device of the present invention can be prepared by forming the above compound into a thin layer by a known method of forming a thin layer, such as the vacuum vapor deposition method, the spin-coating method, and the LB method. Thickness of the layer of the hole transporting region is not particularly limited, and is generally 5 nm to 5 μm. The layer of the hole transporting region may be composed of a single layer comprising one or more types of the hole transporting material described above, or may be a laminate of the layer described above with a layer of the hole transport region of a type different from that of the layer of the hole transport region described above.

Examples of the material of the organic semiconductive layer include:

(1)

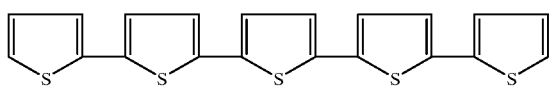

(2)
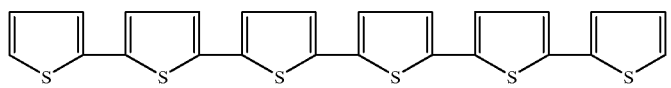
(3)
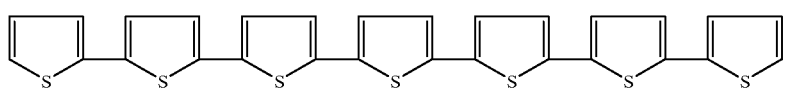
(4)
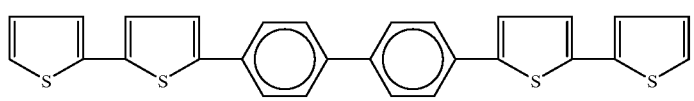
(5)
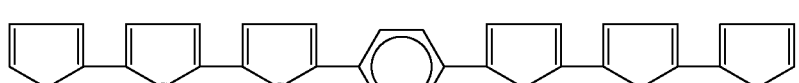
(6)
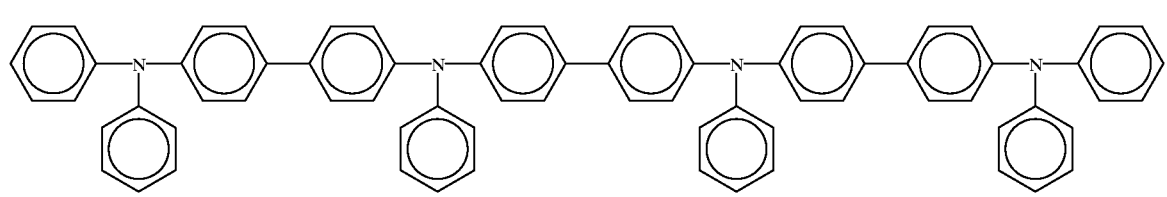
(7)
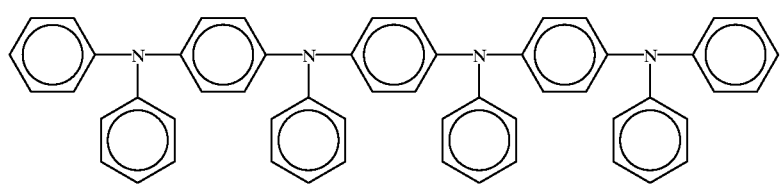
(8)
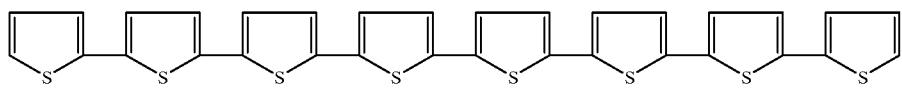
(9)
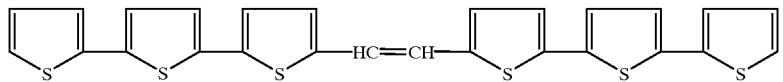
(10)
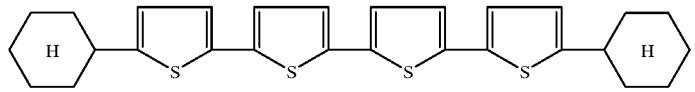
(11)
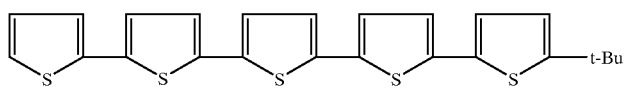
(12)
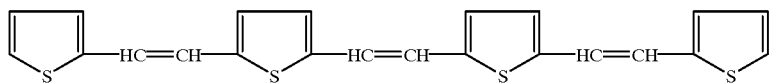
(13)
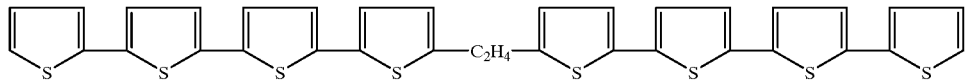

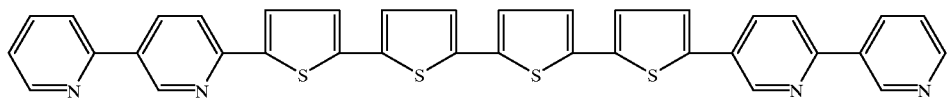
(14)
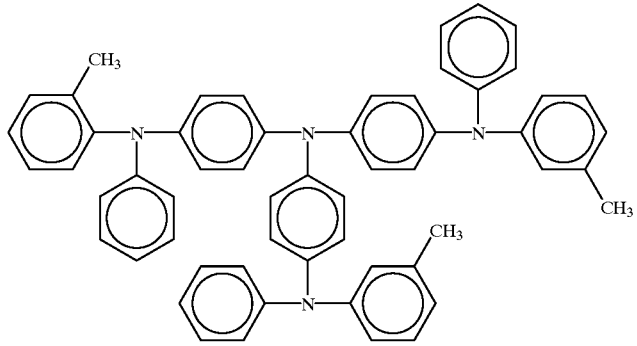
(15)
Examples of the material of the electron barrier layer include:
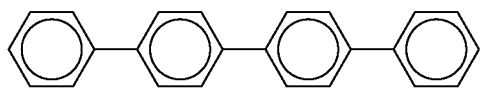
(1)
(2)
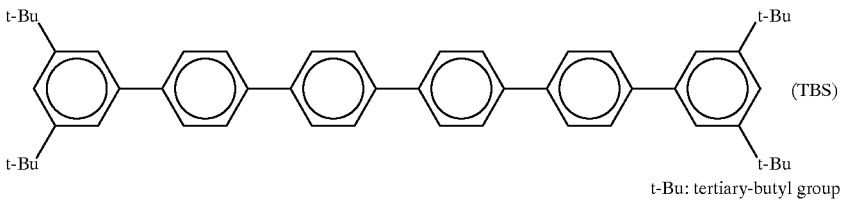
(TBS)
t-Bu: tertiary-butyl group
(3)
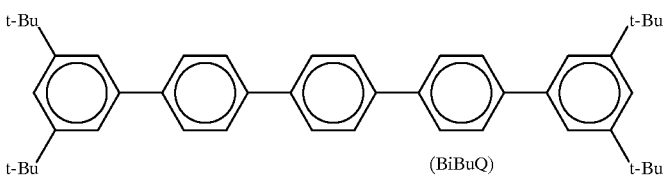
(BiBuQ)
(4)
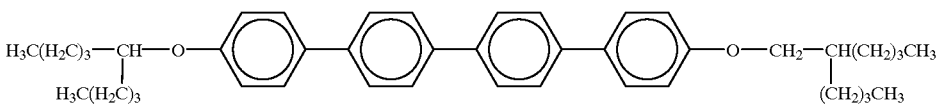
(5)
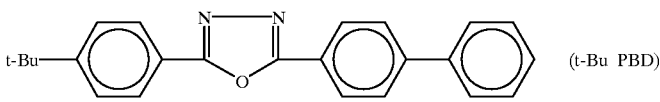
(t-Bu PBD)
(6)

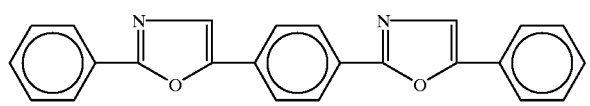 (7)
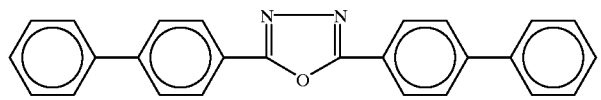 (8)
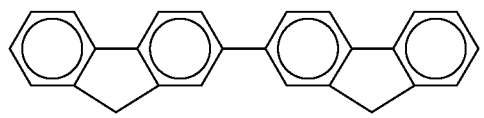 (9)
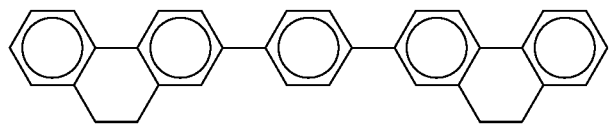 (10)
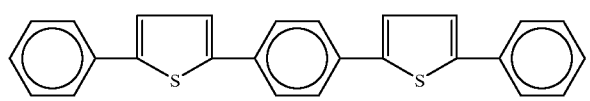 (11)
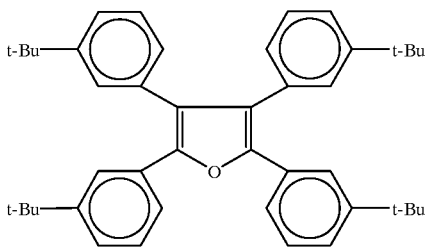 (12)
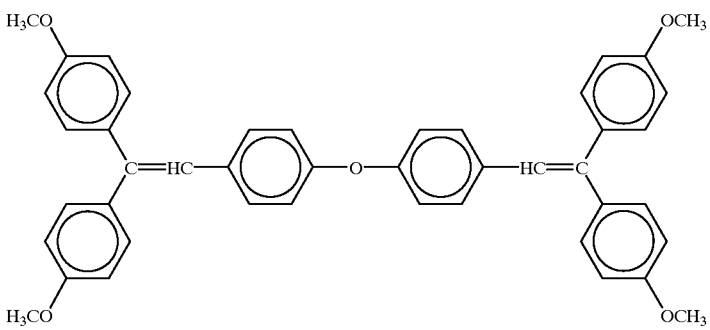 (13)
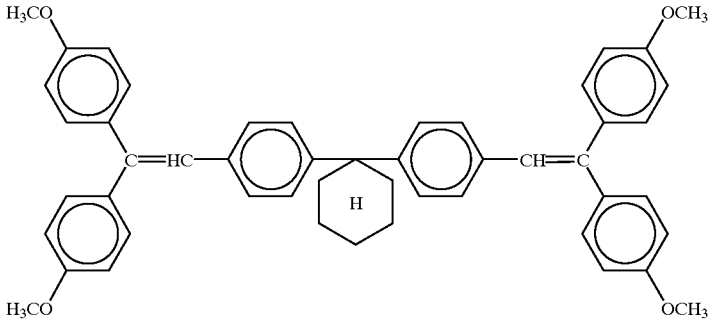 (14)

(15)

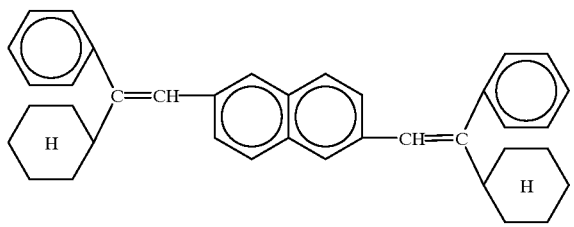

(16)

The electron injecting layer in the organic multi-layer part is made of an electron injecting material and has the function of transporting electrons injected from the cathode to the light emitting layer. The type of the electron injecting material is not particularly limited, and a suitable material can be selected from conventional compounds and used according to desire.

Preferable examples of the electron injecting material include: nitro-substituted fluorenone derivatives, such as:

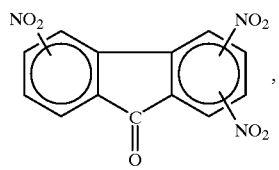

,

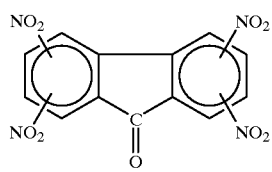

anthraquinodimethane derivatives described in Japanese Patent Application Laid-Open Nos. Showa 57(1982)-149259, Showa 58(1983)-55450, and Showa 63(1988)-104061; diphenylquinone derivatives described in Polymer Preprints, Japan, Volume 37, No. 3, Page 681 (1988), such as:

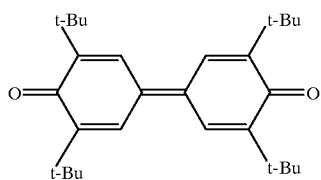

thiopyran dioxide derivatives, such as:

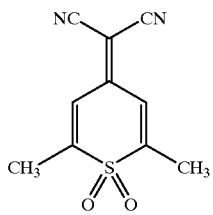

heterocyclic tetracarboxylic acid anhydrides of naphthalenes and perylenes, such as:

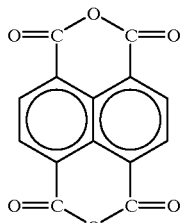

and carbodiimides.

Other preferable examples of the electron injecting material include: compounds having the following formulae which are described in Journal of Applied Physics, Volume 27, No. 269 (1988)):

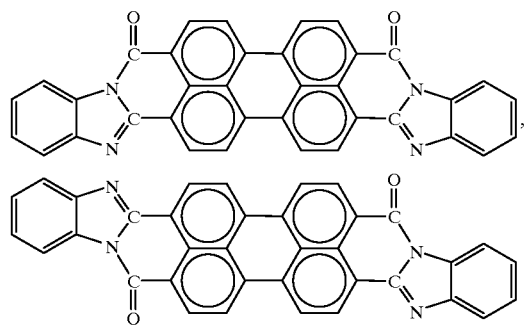

fluorenylidenemethane derivatives described in Japanese Patent Application Laid-Open Nos. Showa 60(1985)-69657, Showa 61(1986)-143784, and Showa 61(1986)-148159; anthraquinodimethane derivatives and anthrone derivatives described in Japanese Patent Application Laid-Open Nos. Showa 61(1986)-225151 and Showa 61(1986)-233750; and oxadiazol derivatives described in Applied Physics Letters, Volume 55, Page 1489 (1989), such as:

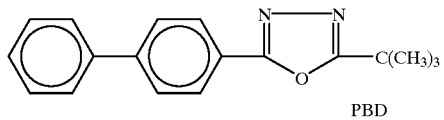

PBD

A series of electron transporting compound have been disclosed in Japanese Patent Application Laid-Open No. Showa 59(1984)-194393 as materials forming the light emitting layer. Studies by the present inventors revealed that the above compounds can be used as the material forming the electron injecting layer. Among these compounds, the following compound is preferable:

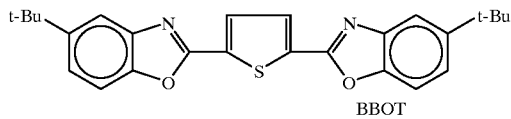

BBOT

The electron injecting layer in the organic EL device of the present invention can be prepared by forming the compound described above into a thin layer by a conventional method of forming a thin film, such as the vapor deposition method, the spin coating method, the casting method, and the LB method. Thickness of the electron injecting layer is generally selected in the range of 5 nm to 5 μm.

The electron injecting layer may be composed of a single layer comprising one or more types of the material for the electron injecting layer described above, or may be a laminate of the layer described above with an electron injecting layer of a type different from that of the electron injecting layer described above.

As the layer for improving adhesion in the organic multi-layer part, a layer containing a material having an excellent electron transporting property and a good adhesive property to the light emitting layer and the cathode is preferable. Examples of such a material include metal complexes of 8-hydroxyquinoline and derivatives thereof, such as metal chelated oxinoid compounds like chelates of oxine (generally, 8-quinolinol or 8-hydroxyquinoline). Specific examples of the material include: tris(8-quinolinol) aluminum, tris(5,7-dichloro-8-quinolinol) aluminum, tris(5, 7-dibromo-8-quinolinol) aluminum, tris(2-methyl-8-quinolinol) aluminum, and corresponding complexes of indium, magnesium, copper, gallium, tin, and lead.

As the material of the layer for improving adhesion, oxadiazol derivatives are preferably used as well. Examples of the oxadiazol derivative include electron transporting compounds represented by the following general formulae (XIV) and (XV):

(XIV)

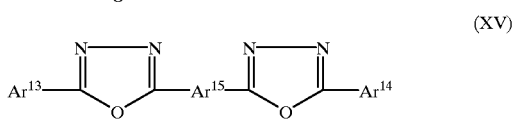

(XV)

wherein $Ar^{11}$ to $Ar^{14}$ indicate each a substituted or unsubstituted aryl group, $Ar^{11}$ and $Ar^{12}$, and $Ar^{13}$ and $Ar^{14}$ may be identical to or different from each other, and $Ar^{15}$ indicates a substituted or unsubstituted arylene group. Examples of the aryl group include phenyl group, biphenyl group, anthranyl group, perylenyl group, and pyrenyl group. Examples of the arylene group include phenylene group, naphthylene group, biphenylene group, anthracenylene group, perylenylene group, and pyrenylene group. Examples of the substituent include an alkyl group having 1 to 10 carbon atoms, an alkoxy group having 1 to 10 carbon atoms, and cyano group. As the electron transporting compound, a compound having the property of forming a thin film is preferable.

Examples of the electron transporting compound include PBD described above and the following compounds:

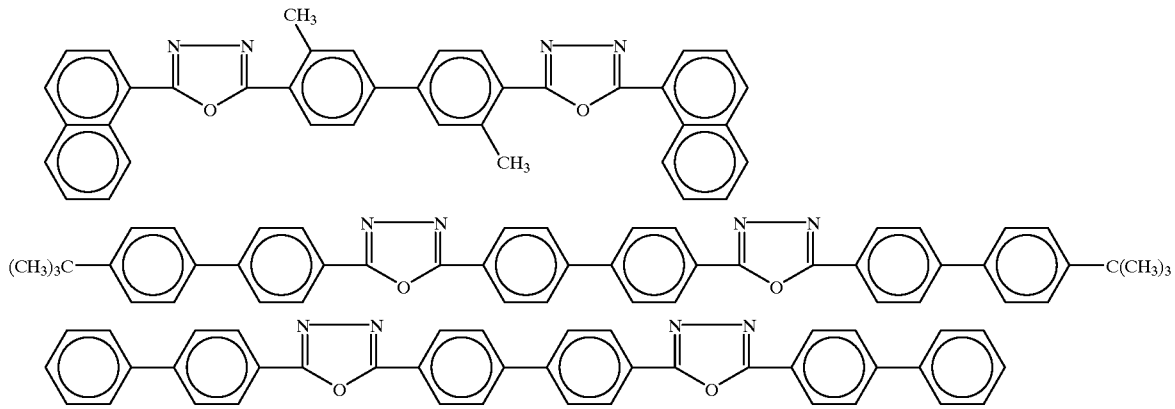

The layer for improving adhesion in the organic multi-layer part of the present invention can be prepared by forming the compound described above into a thin layer by a conventional method of forming a thin layer, such as the vapor deposition method, the spin coating method, the casting method, and the LB method. Thickness of the electron injecting layer is generally selected in the range of 5 nm to 5 μm.

The layer for improving adhesion may be composed of a single layer comprising one or more types of the material having the adhesive property described above, or may be a laminate of the layer described above with a layer for improving adhesion of a type different from that of the layer for improving adhesion described above.

The layer for improving adhesion is made of an electron transporting compound having a good adhesive property. Of course, the layer plays the roll of the electron injecting layer as well.

Technology for forming the organic multi-layer part into a single layer is generally known. In this technology, for example, a hole transporting material, a light emitting material, an electron injecting material, and the like, are mixed with a binder, such as polystyrene, polycarbonate, polyvinylcarbazol, and the like, to form a homogenous mixture, and a single layer formed from this mixture is placed between the anode (the transparent electrode) and the cathode. This technology for forming the single layer is described, for example, in Polymer Preprints, Japan, Volume 40, Page 3591 (1991). In the present invention, an organic single layer part prepared by this technology may be used in place of the organic multi-layer part.

When holes are injected from an outer layer into the organic multi-layer part of the present invention, an auxiliary material for charge injection may be used for the purpose of injecting an increased amount of charge under the same strength of electric field by improving the property for charge injection. The amount of the auxiliary material for charge injection added to each layer of the organic multi-layer part is preferably 19% by weight or less, more preferably 0.05 to 9% by weight, of the weight of the respective layer.

The function of the auxiliary material for charge injection is described in International Patent Application PCT/JP93/01198.

As the auxiliary material for charge injection, stilbene derivatives, distyrylarylene derivatives, and trisstyrylarylene derivative, each having the electron donating property, are used. Specific examples of the material include the following compounds:

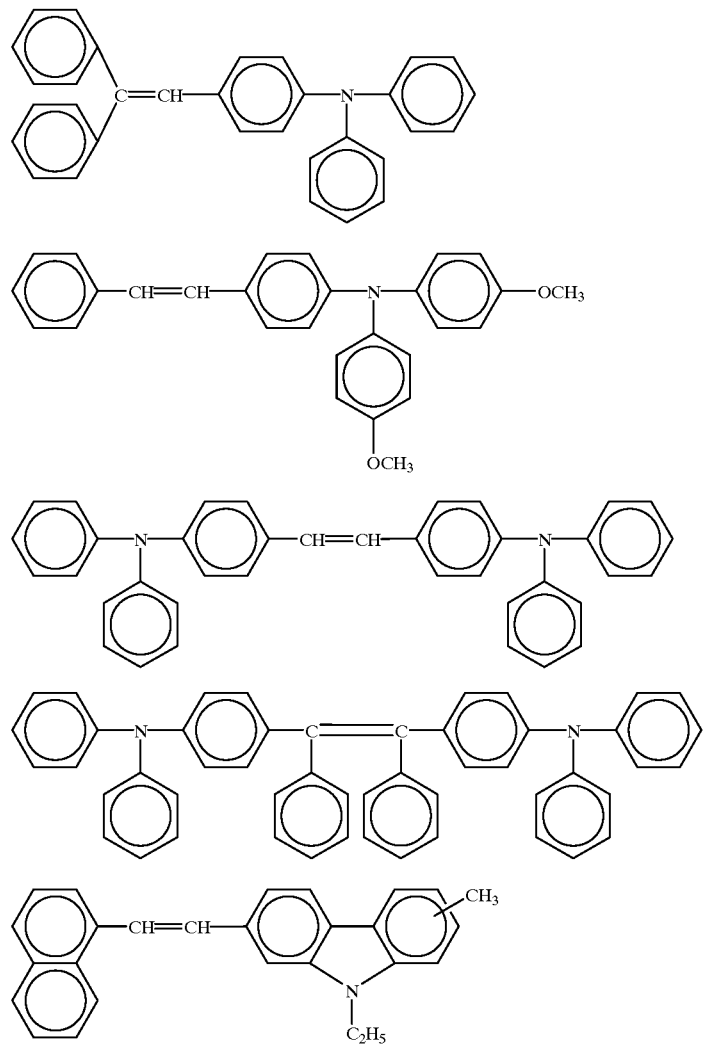

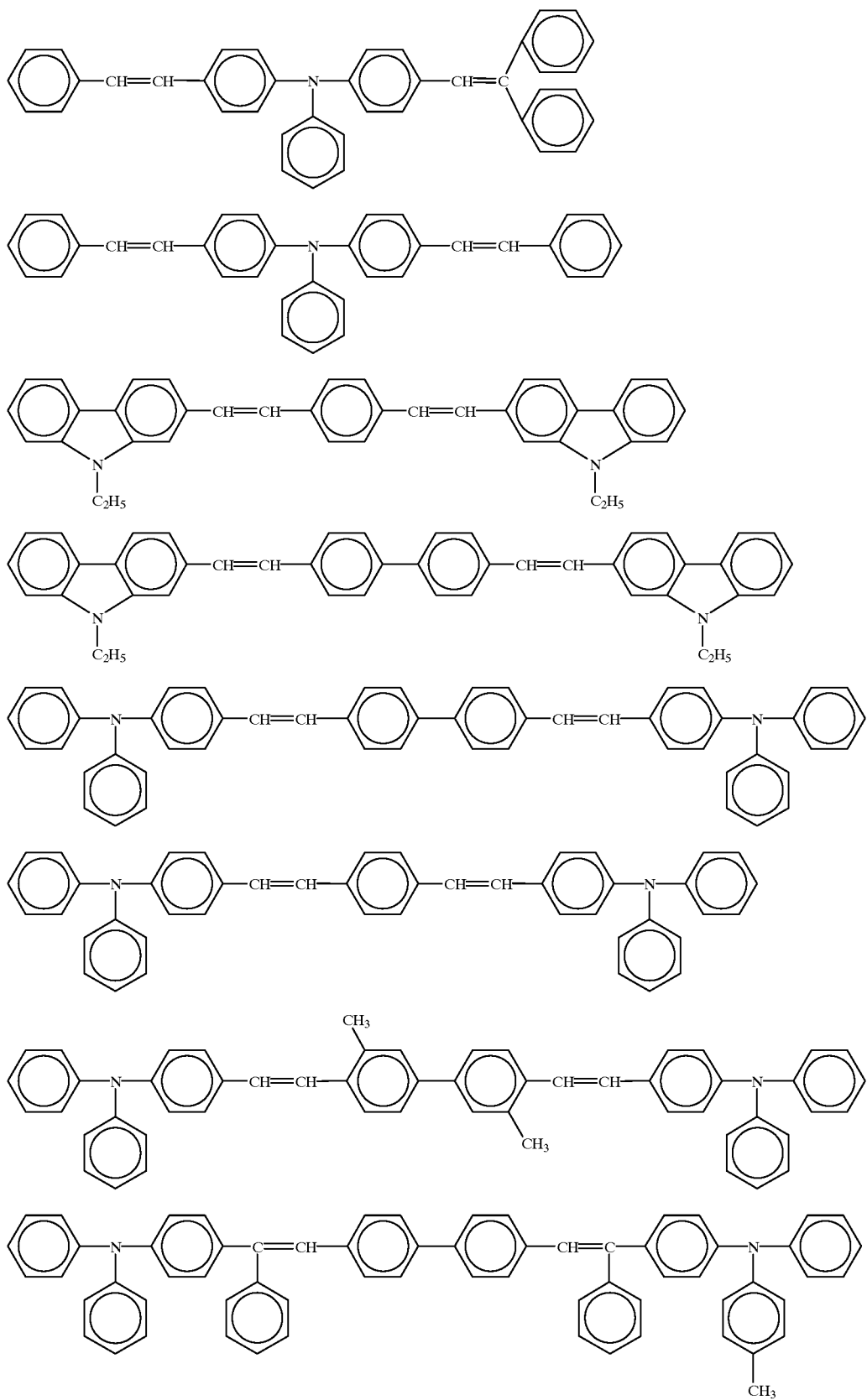

-continued
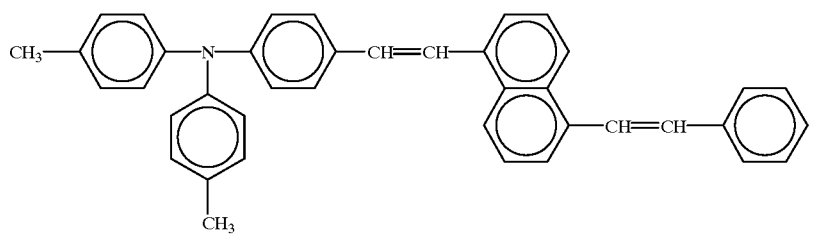
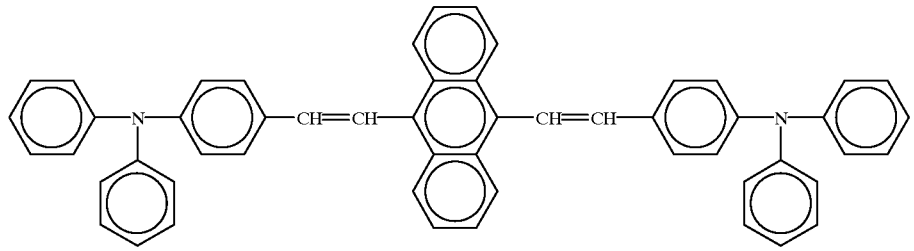
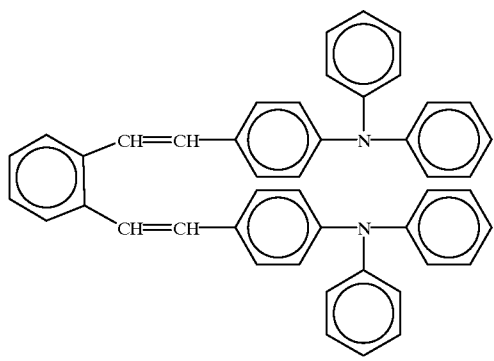
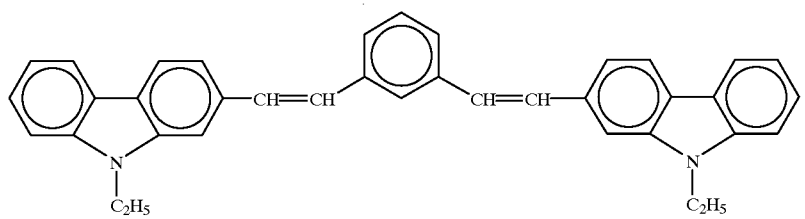
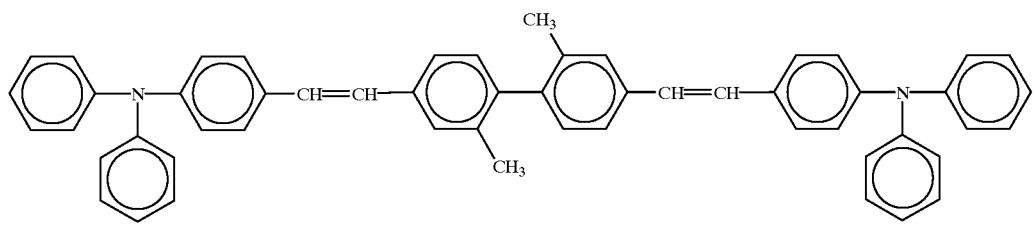
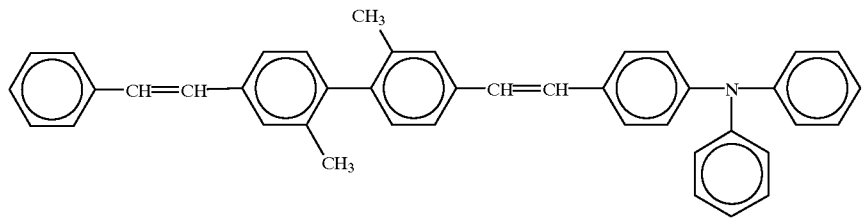

-continued
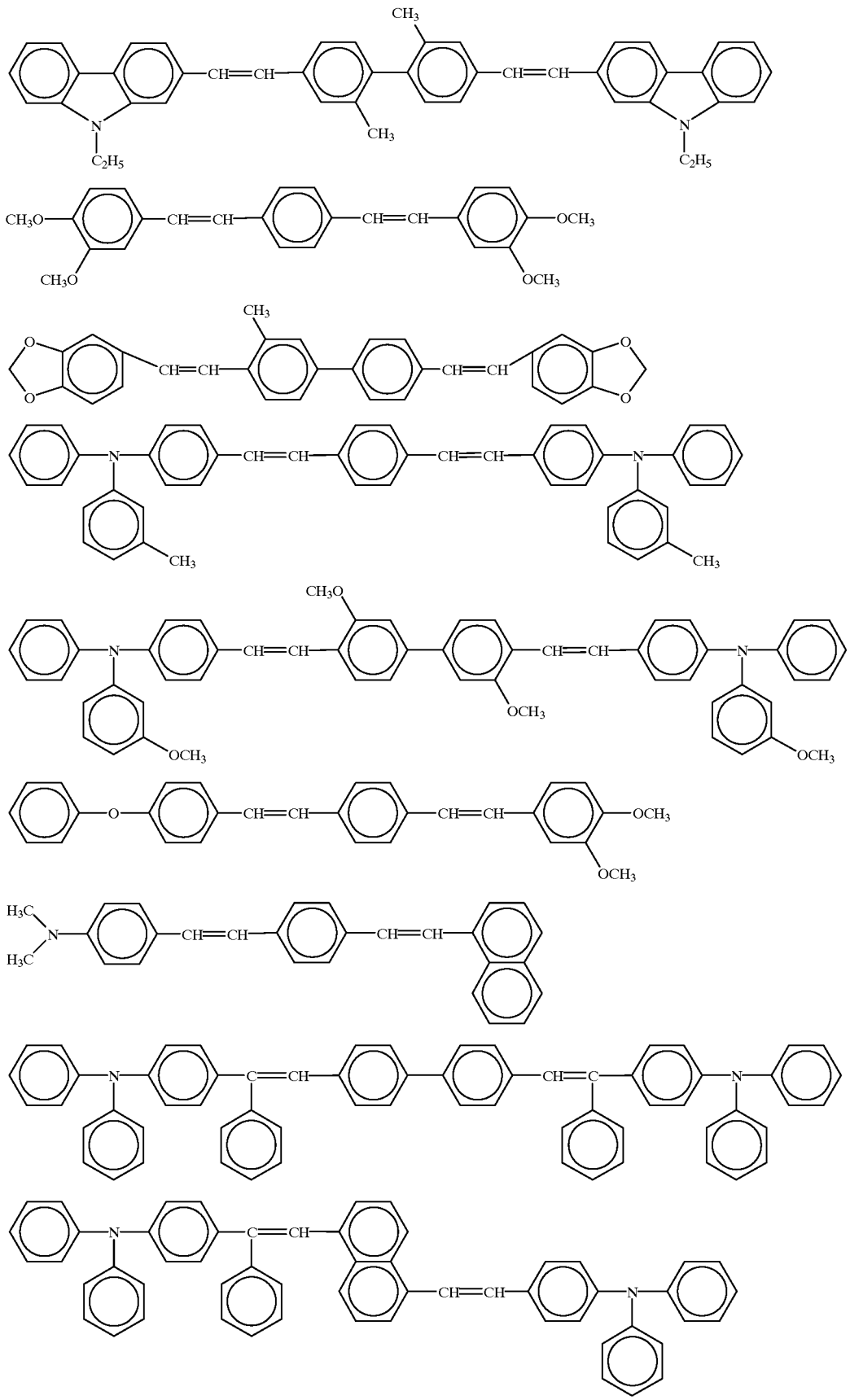

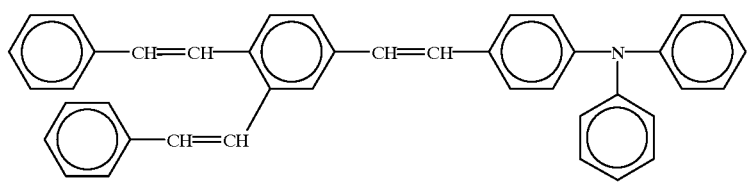
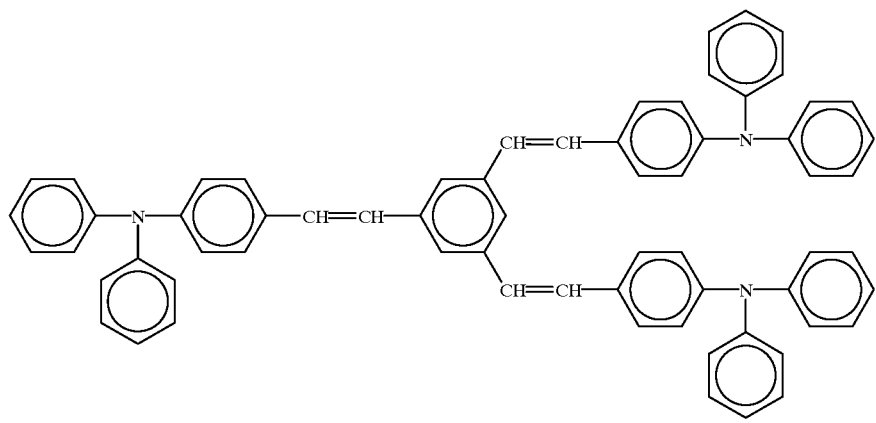
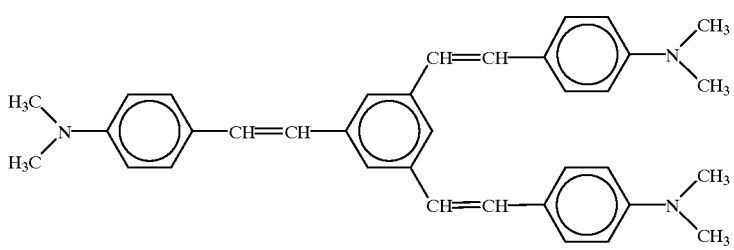
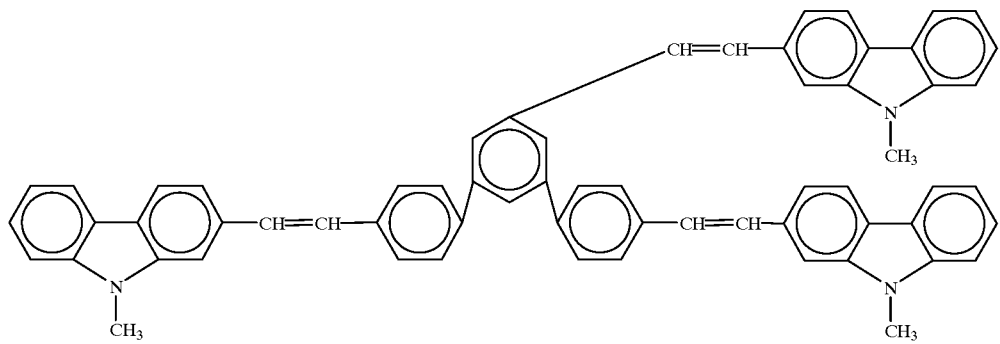
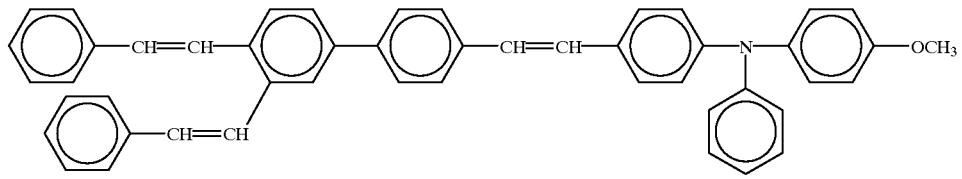
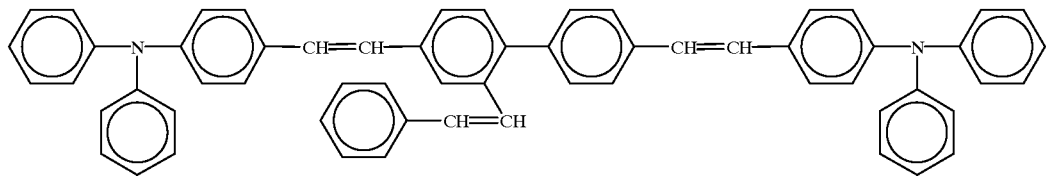

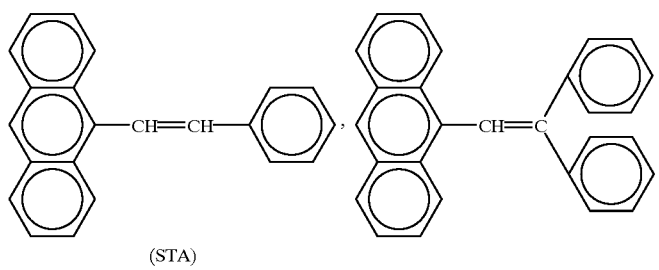
(STA)
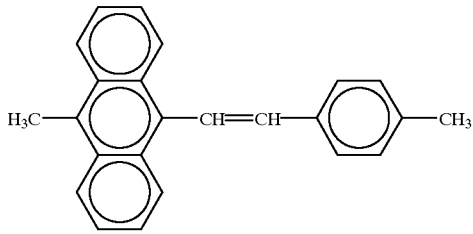
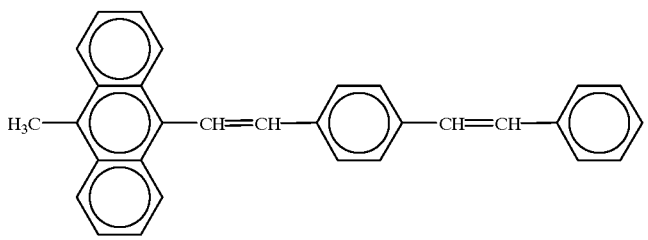
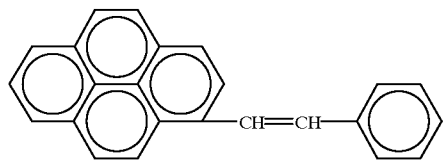
(STPy)
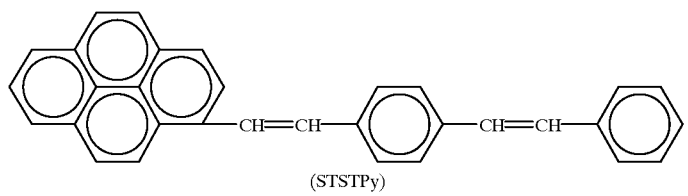
(STSTPy)
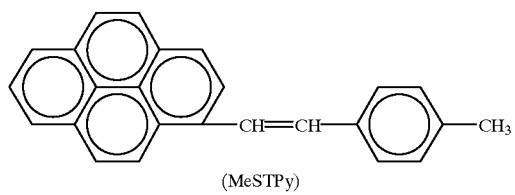
(MeSTPy)
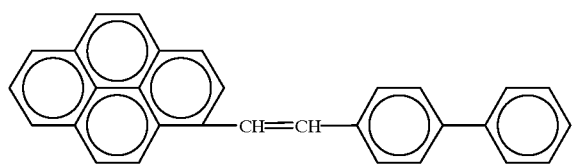
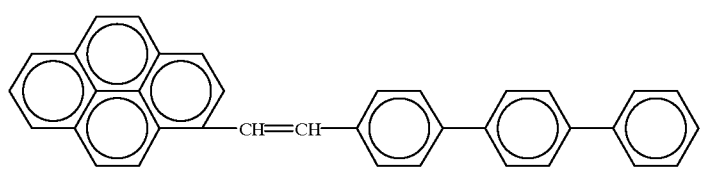

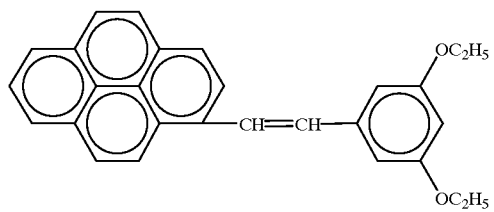
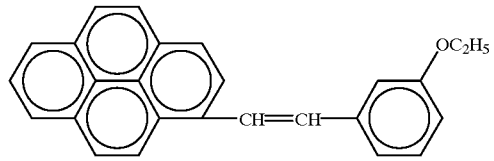
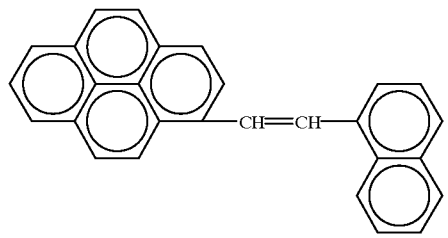
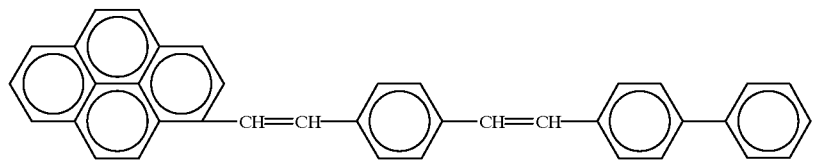
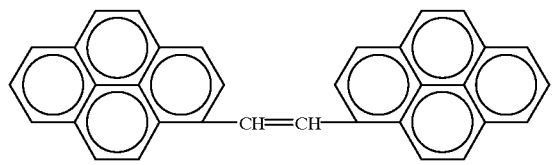
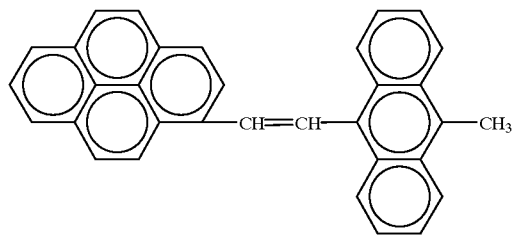
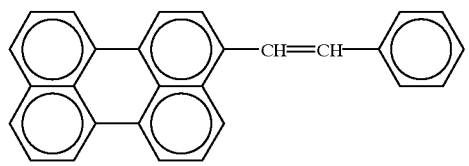
(STPe)
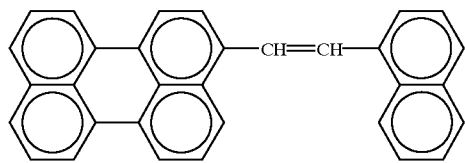

-continued

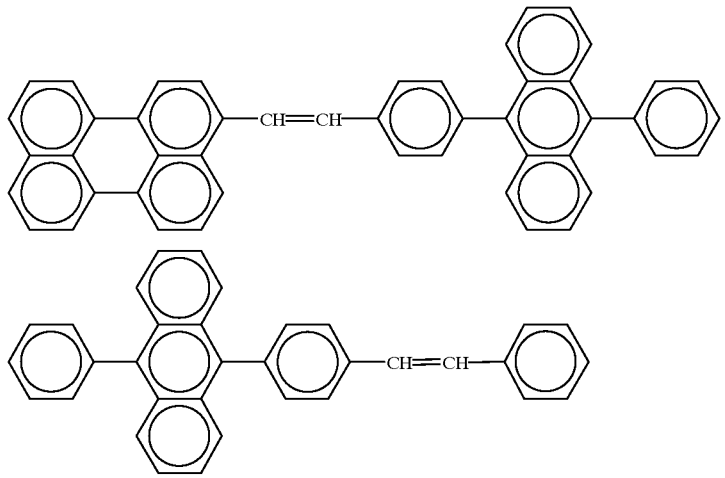

A preferable process of preparation of the EL device of the present invention is described in the following with reference, as an example, to the construction of a substrate/a transparent electrode/a layer of a hole transporting region/a light emitting layer/an electron injecting layer/a cathode. On a suitable substrate, a material for the anode is formed into a thin layer of a desired thickness by a method like the vapor deposition method or the sputtering method, and the transparent electrode (the anode) is prepared. On the transparent electrode thus formed, thin layers of the hole transporting material, the light emitting material, and the electron injecting material are formed.

As the method of forming the thin layer, the spin-coating method, the casting method, the vapor deposition method, and the like, can be used. Among these methods, the vacuum vapor deposition method is preferable because a uniform thin film is more easily obtained and possibility of formation of pin-holes is smaller. When the vacuum vapor deposition method is adopted for the formation of a thin layer, conditions of the vacuum vapor deposition are different according to the kind of compound used, the crystal structure to be formed in the molecular accumulated film, the structure of aggregation, and the like. It is generally preferred that the heating temperature of a boat is suitably selected in the range of 50 to 400° C. for, the vacuum is suitably selected in the range of $10^{-6}$ to $10^{-8}$ Pa, the rate of vapor deposition is suitably selected in the range of 0.01 to 50 nm/sec, the substrate temperature is suitably selected in the range of –50 to 300° C., and the thickness of the layer is suitably selected in the range of 5 nm to 5 μm. After these layers are formed, a thin layer made of a cathode material is formed to a thickness of 10 μm to 500 nm, preferably 50 to 200 nm, by a method, such as the vapor deposition method or the sputtering method, to form the cathode. Thus, the desired EL device can be obtained.

When the EL device thus prepared is loaded with a direct voltage, light emission of a high color purity is observed with a voltage of 5 to 40 V in the condition that the anode is connected to a positive electrode (+) and the cathode is connected to a negative electrode (−). When the connection is reversed, no electric current is observed and no light is emitted at all. When the EL device is loaded with an alternating voltage, light emission is observed only in the condition that the polarity of the anode is positive and the polarity of the cathode is negative. Wave shape of the loaded alternating voltage is selected according to desire.

To summarize the advantages of the present invention, an organic EL device having particularly increased color purity of the blue light emission can be easily obtained by controlling the optical thickness of the layers from the anode to the cathode in a device of a specific construction.

The organic EL device of the present invention can be advantageously used, for example, as a device for display of information and display of numbers and characters.

The present invention is described in more detail with reference to examples in the following; however, these examples are intended to illustrate the invention and are not to be construed to limit the scope of the invention.

Examples 1 to 3 and Comparative Examples 1 to 3
(1) Preparation of an EL Device

A product (produced by Geomatic Co.) having a layer of ITO of a nm thickness formed by the vapor deposition method on a glass substrate of 25 mm×75×1.1 mm (a product of Nippon Plate Glass Co., Ltd.; OA-2) was used as the transparent supporting substrate. This substrate was washed in isopropyl alcohol for 10 minutes with ultrasonic wave. The washed substrate was dried by blowing dry nitrogen thereto, and then treated with UV ozone washing for 10 minutes by using an apparatus manufactured by Samco International Institute, Inc. (UV-300).

This transparent supporting electrode substrate was fixed to a substrate holder of a commercial vapor deposition system (a product of Nippon Shinku Gijutu Co., Ltd.). In an electrically heated boat made of molybdenum, 200 mg of N,N'-bis(3-methylphenyl)-N,N'-diphenyl-(1,1-biphenyl)-4,4'-diamine (TPD) was placed. In another electrically heated boat made of molybdenum, 200 mg of 4,4'-bis(2,2'-diphenylvinyl)biphneyl-(DPVBi) was placed. In still another electrically heated boat made of molybdenum, 200 mg of compound (A) (shown in Table 1) used as the auxiliary material for charge injection was placed. The vacuum chamber was evacuated to $1\times10^{-4}$ Pa. Then, the boat containing TPD was heated to 215 to 220° C., and TPD was evaporated by vapor deposition on the transparent supporting substrate at a deposition rate of 0.1 to 0.3 nm/sec to form a hole injecting layer of b nm thickness. The temperature of the substrate in this deposition process was a room temperature. Without breaking vacuum, DPVBi used as the host material was evaporated on the hole injecting layer at a thickness of c nm. The boat containing the compound (A) was heat at the same time to mix compound (A) in the light emitting layer. In this process, the rate of the vapor deposition of compound (A) was (C) (shown in Table 1) while the rate of the vapor deposition of DPVBi was (B) (shown in Table 1).

Subsequently, the vacuum chamber was opened. In an electrically heated boat made of molybdenum, the aluminum

TABLE 1

|  | (A) | (B) (nm/sec) | (C) (nm/sec) |
|---|---|---|---|
| Example 1 | PAVBi | 2.8~3.5 | 0.075 |
| Example 2 | PAVB | 3.2~3.4 | 0.10 |
| Example 3 | PAVTP | 2.7~3.5 | 0.13 |
| Comparative Example 1 | PAVBi | 2.5~3.0 | 0.09 |
| Comparative Example 2 | PAVB | 3.0~4.0 | 0.09 |
| Comparative Example 3 | PAVTP | 2.7~3.5 | 0.13 |

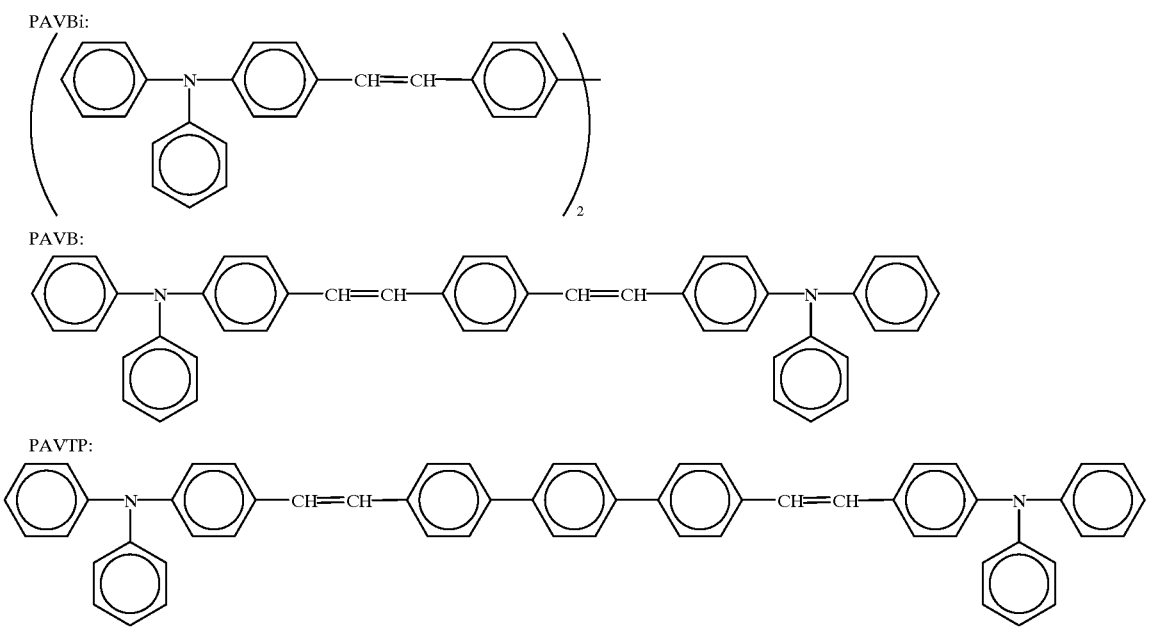

complex of 8-hydroxyquinoline (Alq) used as the material of the adhesive layer was placed. Then, 1 g of magnesium ribbon was placed in another electrically heated boat made of molybdenum, and 500 mg of silver wire was placed in a tungsten basket. The vacuum chamber was evacuated to $1 \times 10^{-4}$ Pa.

The aluminum complex of 8-hydroxyquinoline (Alq) was vapor deposited at a rate of vapor deposition of 0.01 to 0.03 nm/sec to form an adhesive layer of d nm. Then, silver and magnesium were vapor deposited simultaneously at rates of vapor deposition of 0.1 nm/sec and 1.4 n/sec, respectively, and the mixed electrode of silver and magnesium thus formed was used as the cathode. The thickness of the layer was 150 nm.

The reflection at the cathode was 85%.

The thickness of the layers are shown in Table 2.

The refractive indices of the layers were measured separately for each layer by using an ellipsometer. The refractive indices of ITO, TPD, DPBVi (a doped layer), and Alq layers were 1.86, 1.7, 1.75, and 1.7, respectively. From the values thus obtained, $(nd)_1$, $(nd)_2$, and $[(nd)_1+(nd)_2]$ of the device prepared above were obtained. Results are shown in Table 3 together with the values of $\lambda$ and m.

TABLE 2

|  | thickness of layer | | | |
|---|---|---|---|---|
|  | a | b | c | d |
| Example 1 | 120 | 80 | 40 | 20 |
| Example 2 | 120 | 80 | 40 | 20 |
| Example 3 | 100 | 110 | 40 | 20 |
| Comparative Example 1 | 100 | 60 | 40 | 20 |
| Comparative Example 2 | 100 | 60 | 40 | 20 |
| Comparative Example 3 | 100 | 80 | 40 | 20 |

TABLE 3

|  | optical thickness | | | | |
|---|---|---|---|---|---|
|  | organic multi-layer part $(nd)_1$ | transparent electrode $(nd)_2$ | $[(nd)_1 + (nd)_2]$ | $\lambda$ (nm) | m |
| Example 1 | 80 × 1.7 + 40 × 1.75 + 20 × 1.7 | 120 × 1.86 | 463 | 463 | 2 |
| Example 2 | 80 × 1.7 + 40 × 1.75 + 20 × 1.7 | 120 × 1.86 | 463 | 463 | 2 |

TABLE 3-continued

| | optical thickness | | | | |
|---|---|---|---|---|---|
| | organic multi-layer part $(nd)_1$ | transparent electrode $(nd)_2$ | $[(nd)_1 + (nd)_2]$ | λ (nm) | m |
| Example 3 | 110 × 1.7 + 40 × 1.75 + 20 × 1.7 | 100 × 1.86 | 477 | 477 | 2 |
| Comparative Example 1 | 60 × 1.7 + 40 × 1.75 + 20 × 1.7 | 100 × 1.86 | 392 | 392 | 2 |
| Comparative Example 2 | 60 × 1.7 + 40 × 1.75 + 20 × 1.7 | 100 × 1.86 | 392 | 392 | 2 |
| Comparative Example 3 | 80 × 1.7 + 40 × 1.75 20 × 1.7 | 100 × 1.86 | 426 | 426 | 2 |

In Example 1 to 3, λ of a blue wavelength satisfied the relation expressed by the equation $4\pi/\lambda[(nd)_1+(nd)_2]=2m\pi$ (m=2). In contrast, λ deviated from the blue wave length (the blue wave length: λ=440 to 490 nm) in Comparative Examples 1 to 3.

(2) Measurement of the Luminance and the Color Purity of the Device

The device obtained in (1) described above was applied with a voltage shown in Table 4 and the amount of electric current, luminance, and chromaticity were obtained. Results are shown in Table 4.

TABLE 4

| | voltage (V) | electric current (mA/cm²) | luminance (cd/m²) | chromaticity |
|---|---|---|---|---|
| Example 1 | 8 | 5.14 | 215 | (0.159, 0.192) |
| Example 2 | 8 | 3.0 | 194 | (0.180, 0.275) |
| Example 3 | 8 | 3.38 | 102 | (0.173, 0.181) |
| Comparative Example 1 | 6 | 6.9 | 119 | (0.157, 0.242) |
| Comparative Example 2 | 8 | 2.58 | 160 | (0.179, 0.326) |
| Comparative Example 3 | 8 | 6.67 | 253 | (0.181, 0.215) |

As can be understood from comparisons between Example 1 and Comparative Example 1, Example 2 and Comparative Example 2, and Example 3 and Comparative Example 3, the values of the y-coordinate (chromaticity) in Examples were smaller than those in Comparative Examples. This result shows that the relation expressed by the equation $4\pi/\lambda[(nd)_1+(nd)_2]=2m\pi$ (m=2) is satisfied and the purity of the blue color emission is increased because the optical thickness in the Examples are set at the central wave length of blue color (λ).

(3) The EL Spectrum of the Device

The EL spectra of the devices obtained in Example 1 and Comparative Example 1 were measured. Results are shown in FIG. 2.

Figure 2:
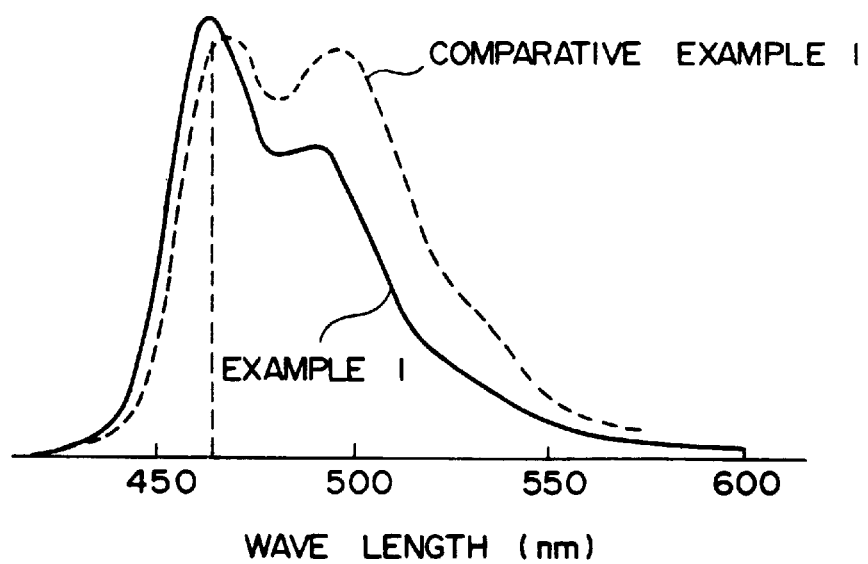
FIG. 2 shows EL spectra of the devices obtained in Example 1 and Comparative Example 1.

As clearly shown in FIG. 2, the peak at 460 nm was enhanced to a larger value in Example 1. This shows that the purity of the blue color emission was increased by the construction of the device of the present invention.

Examples 4 to 6

(1) Preparation of a Device

EL devices having the thickness shown in Table 5 were prepared by the same method as that used in Example 1, except the following points: in Example 4, an ITO having a high refractive index of 1.92 was used in place of the ITO used in Example 1; in Example 5, a TiO₂ layer having a refractive index of 2.4 used as the underlayer of a high refractivity was formed to the thickness of 48 nm between the substrate and the ITO layer by the vacuum vapor deposition; and in Example 6, a MgF₂ layer having a refractive index of 1.38 used as the underlayer of a low refractivity was formed to the thickness of 80 nm between the substrate and the ITO layer by the vacuum vapor deposition.

The thickness of the layers are shown in Table 5, and λ and m are shown in Table 6.

TABLE 5

| | thickness of layer | | | | | |
|---|---|---|---|---|---|---|
| | a | b | c | d | TiO₂ layer | MgF₂ layer |
| Example 4 | 116 | 80 | 40 | 20 | — | — |
| Example 5 | 60 | 80 | 40 | 20 | 48 | — |
| Example 6 | 120 | 80 | 40 | 20 | — | 80 |

TABLE 3

| | optical thickness | | | | | |
|---|---|---|---|---|---|---|
| | organic multi-layer part $(nd)_1$ | transparent electrode $(nd)_2$ or $(nd)_3$ | TiO₂ layer $(nd)_4$ | $[(nd)_1 + (nd)_2]$ or $[(nd)_1 + (nd)_3]$ | λ (nm) | m |
| Example 4 | 80 × 1.7 + 40 × 1.75 + 20 × 1.7 | 116 × 1.92 | — | 463 | 463 | 2 |
| Example 5 | 80 × 1.7 + 40 × 1.75 + 20 × 1.7 | 60 × 1.86 | 48 × 2.4 | 351 | 470 | 2 |
| Example 6 | 80 × 1.7 + 40 × 1.75 + 20 × 1.7 | 120 × 1.86 | — | 463 | 463 | 2 |

In Example 5, the reflection took place at the interface of the underlayer of a high refractivity and the transparent electrode, and the optical thickness is $[(nd)_1+(nd)_3]$. Because the phase changed by π at the interface, the relation expressed by the equation $4\pi/\lambda[(nd)_1+(nd)_3]=(2m-1)\pi$, (m=2) was satisfied in this case.

The relations expressed by the equations $4\pi/\lambda[(nd)_1+(nd)_3+(nd)_4]=2m\pi$, (m=2) and $4\pi/\lambda[(nd)_1+(nd)_3]=(2m-1)\pi$, (m=2) (wherein, λ=466 nm) were satisfied in Example 5 as described above. Therefore, it is shown that the purity of the blue light emission was particularly increased in Example 5.

(2) Measurement of the Luminance and the Color Purity of the Device

The device obtained in (1) described above was loaded with a voltage shown in Table 7 and the amount of electric current, luminance, and chromaticity were obtained. Results are shown in Table 7.

TABLE 7

| | voltage (V) | electric current (mA/cm²) | luminance (cd/m²) | chromaticity |
|---|---|---|---|---|
| Example 4 | 8 | 5 | 200 | (0.159, 0.170) |
| Example 5 | 8 | 4.5 | 170 | (0.151, 0.134) |
| Example 6 | 8 | 4.5 | 210 | (0.158, 0.175) |

The devices in Examples 4 to 6 showed higher purities of the blue light emission than that of the device in Comparative Example 1.

The results in Examples 1 to 6 show that the efficiency of the EL device of the present invention was not changed or rather improved while the purity of the blue light emission was increased. This shows remarkable technical superiority of the construction of the present invention to the construction using a color filter, in which the efficiency is decreased by ½ to ⅓. Furthermore, the EL device of the construction of the present invention is very simple and can be easily prepared.

What is claimed is:

1. An organic electroluminescence device comprising:

a transparent substrate, a transparent electrode having a refractive index of 1.80 or more, an electroluminescent organic multi-layer part having a refractive index of 1.6 to 1.8 which emits electroluminescent light, and a cathode, which components are laminated in this order and which layer configuration selectively reflects a wavelength band of electroluminescent light, wherein the organic multi-layer part comprises an adhesion improving layer laminated to said cathode, wherein the optical thickness of the organic multi-layer part and the transparent electrode expressed as the sum: are set at values which satisfy the equation: $4\pi/\lambda = 2m\pi$ or $(2m-1)\pi$, where $(nd)_1$ indicates the optical thickness of the organic multi-layer part, $(nd)_2$ indicates the optical thickness of the transparent electrode, m is an integer of 1 to 10, n is the refractive index of each respective part, d is the thickness of each respective part, and $\lambda$ is the central wavelength of the selectively reflected band of electroluminescent light, the choice of the $2m\pi$ equation or the $(2m-1)\pi$ equation being dependent on the refractive index of the cathode relative to the refractive index of the organic multi-layer part, and the optical thickness values $(nd)_1$ and $(nd)_2$ being set so that the central wavelength $\lambda$ of the selectively reflected band of electroluminescent light has a specific wavelength value within a wavelength range of 440 to 490 nm, 500 to 550 nm or 600 to 650 nm.

2. The organic electroluminescence device of claim 1, wherein said adhesion improving layer comprises an oxinoid compound.

3. The organic electroluminescence device of claim 2, wherein said oxinoid compound is a metal chelate of an oxine.

* * * * *